(12) United States Patent
Yamazaki et al.

(10) Patent No.: US 6,713,323 B2
(45) Date of Patent: Mar. 30, 2004

(54) SEMICONDUCTOR DEVICE AND METHOD OF MANUFACTURING THE SAME

(75) Inventors: Shunpei Yamazaki, Tokyo (JP);
Osamu Nakamura, Kanagawa (JP);
Takashi Hamada, Kanagawa (JP);
Satoshi Murakami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 4 days.

(21) Appl. No.: 10/058,158

(22) Filed: Jan. 29, 2002

(65) Prior Publication Data

US 2002/0102776 A1 Aug. 1, 2002

(30) Foreign Application Priority Data

Jan. 30, 2001 (JP) ........................................ 2001-022386

(51) Int. Cl.$^7$ ............................................. H01L 21/339
(52) U.S. Cl. ...................... 438/146; 438/149; 438/151; 438/143; 438/471; 438/520
(58) Field of Search ................................. 438/146, 149, 438/471, 520, 151, 143

(56) References Cited

U.S. PATENT DOCUMENTS

| | | |
|---|---|---|
| 5,643,826 A | 7/1997 | Ohtani et al. |
| 6,306,694 B1 * | 10/2001 | Yamazaki et al. ........... 438/151 |
| 6,551,907 B2 * | 4/2003 | Ohtani ........................ 438/476 |
| 6,555,448 B2 * | 4/2003 | Fukushima .................. 438/471 |
| 6,599,785 B2 * | 7/2003 | Hamada et al. .............. 438/151 |

FOREIGN PATENT DOCUMENTS

| | | |
|---|---|---|
| JP | 05-109737 | 4/1993 |
| JP | 07-130652 | 5/1995 |
| JP | 07-183540 | 7/1995 |
| JP | 2001-210828 | 8/2001 |

* cited by examiner

*Primary Examiner*—Michael S. Lebentritt
*Assistant Examiner*—Michael K. Luhrs
(74) *Attorney, Agent, or Firm*—Nixon Peabody LLP; Jeffrey L. Costellia

(57) ABSTRACT

A semiconductor device is manufactured by a method in which the number of heat treatments at a high temperature (600° C. or higher) is reduced to thereby achieve a process at a low temperature (600° C. or lower), and a simplified process and improvement in throughput are realized. An impurity region to which a rare gas element (also called a rare gas) is added is formed on a semiconductor film of a crystalline structure by using a mask. Gettering is performed in such a manner that a metallic element contained in the semiconductor film is caused to segregate in the impurity region by heat treatment. The impurity region is thereafter used as a source or drain region.

45 Claims, 21 Drawing Sheets

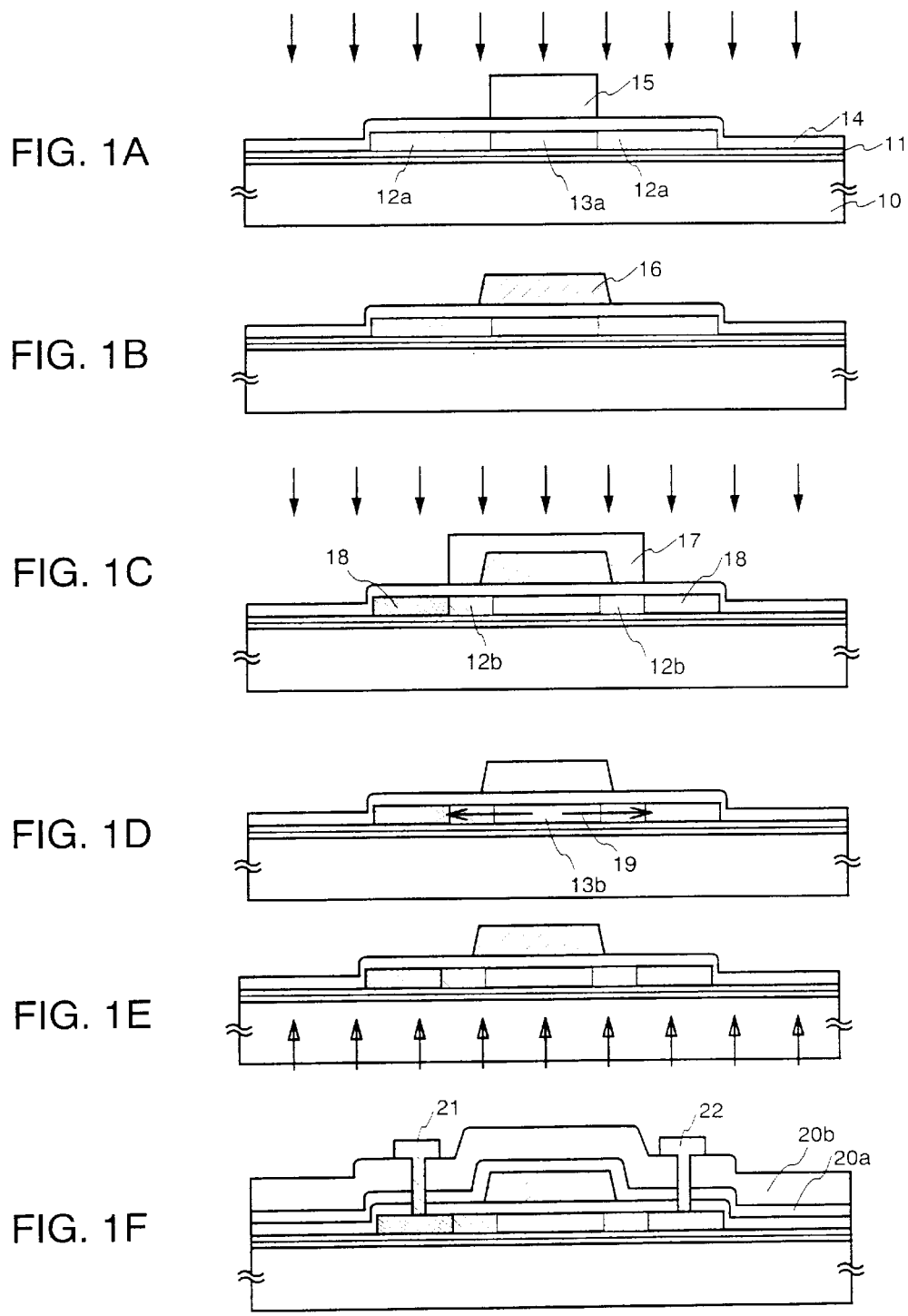

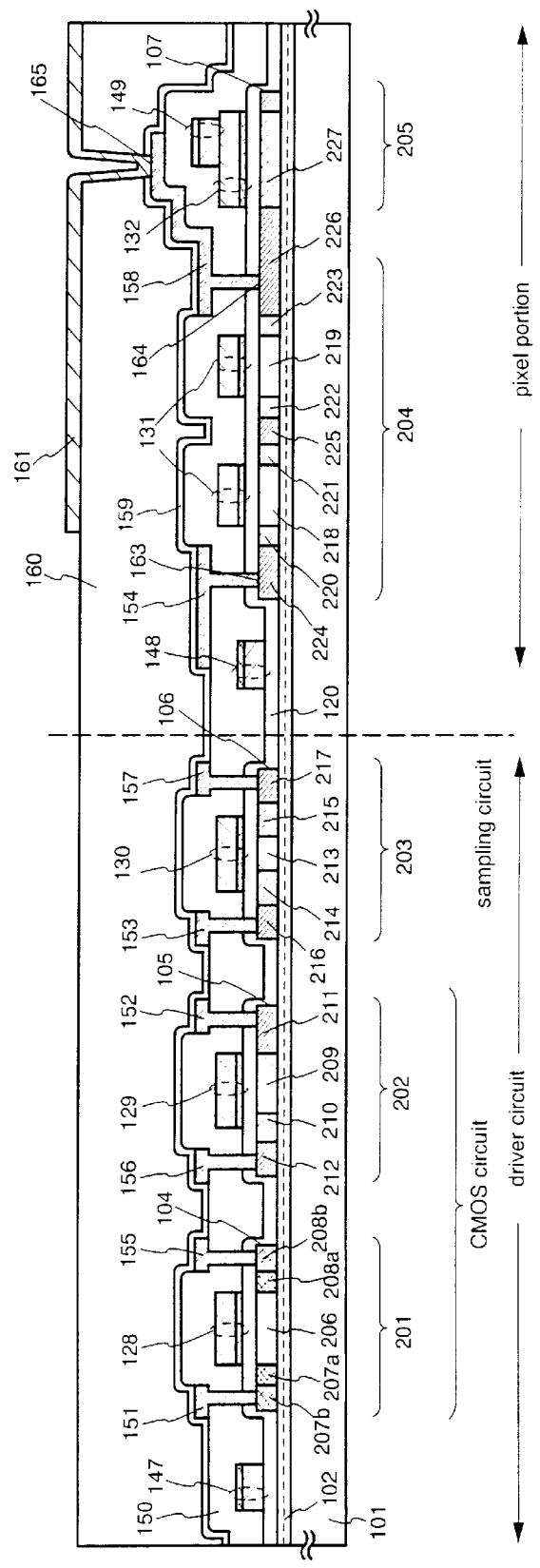

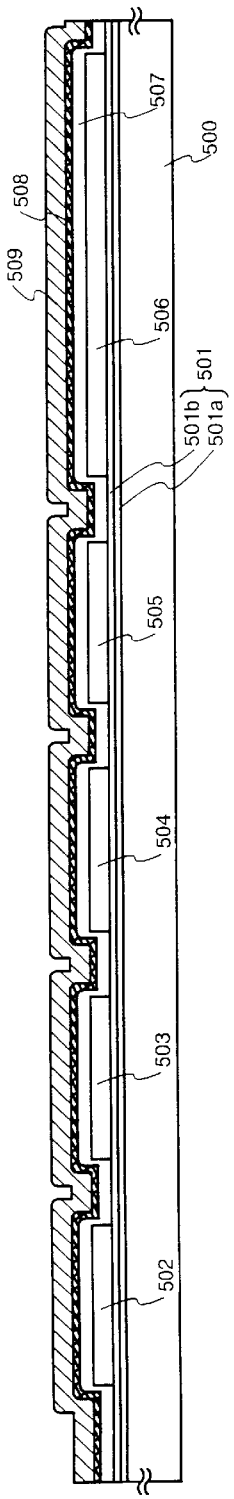
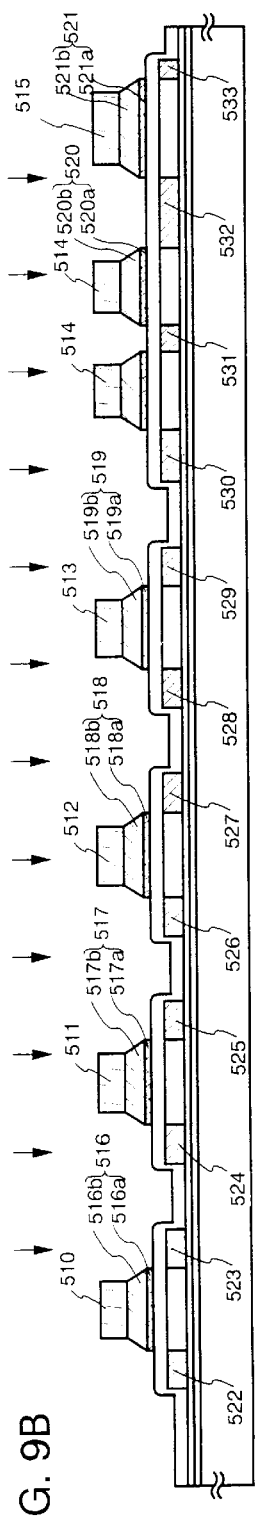
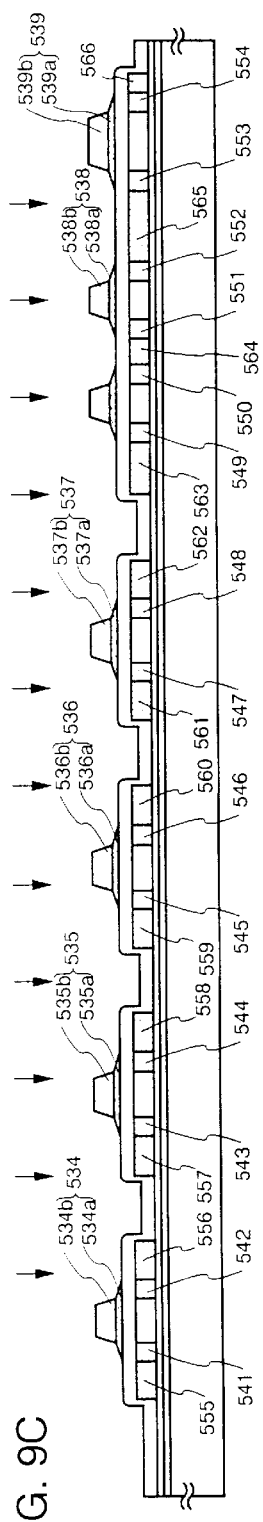
FIG. 9A
FIG. 9B
FIG. 9C

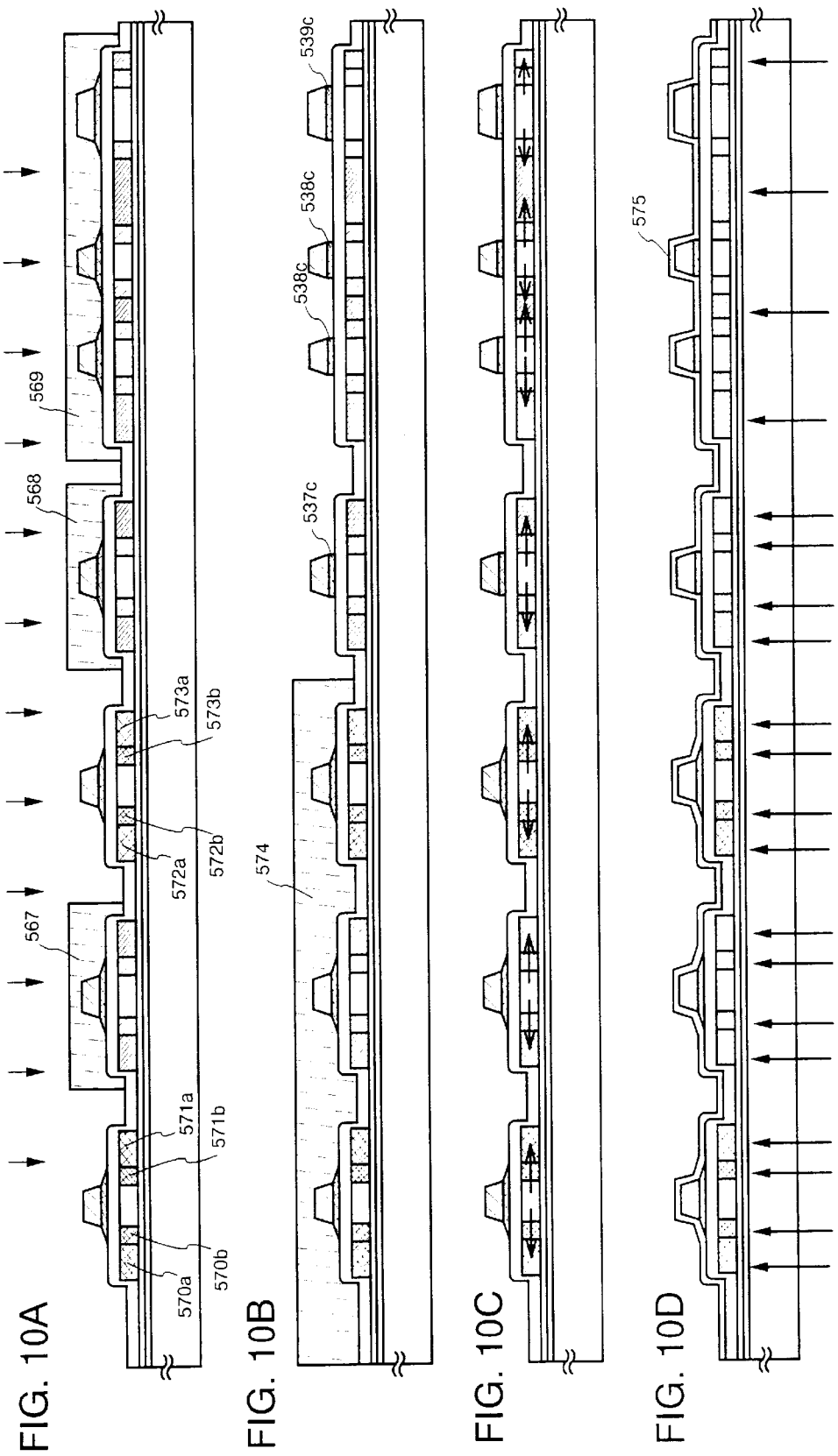

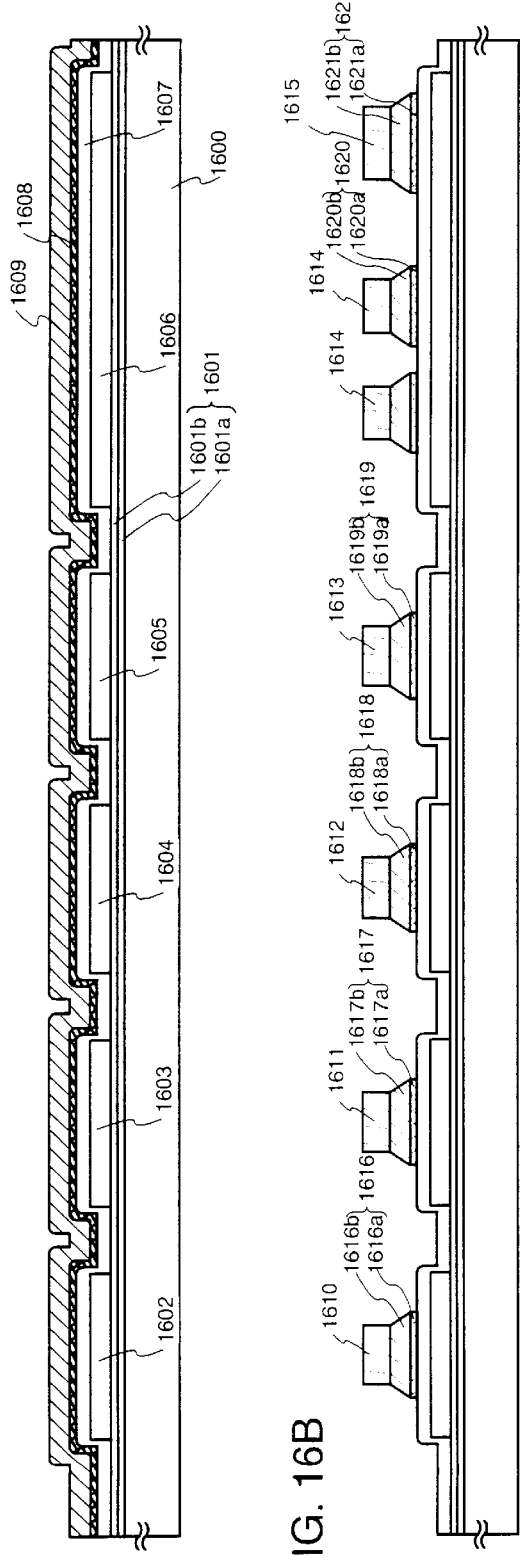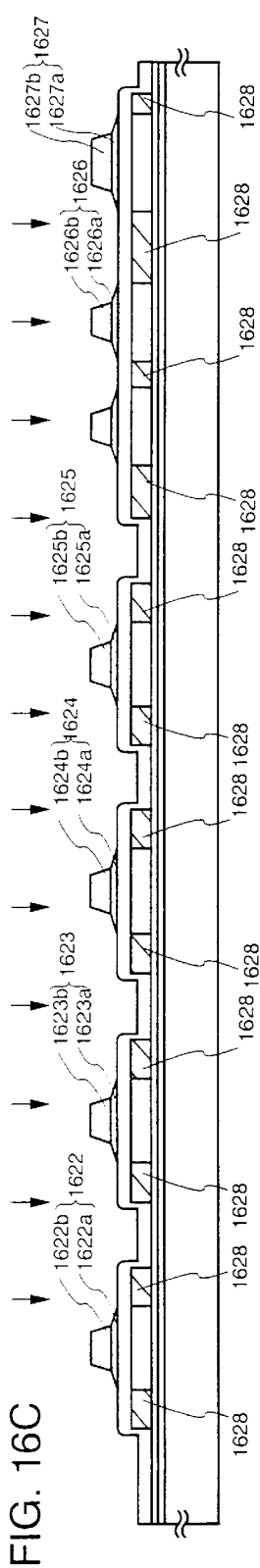
FIG. 16A
FIG. 16B
FIG. 16C

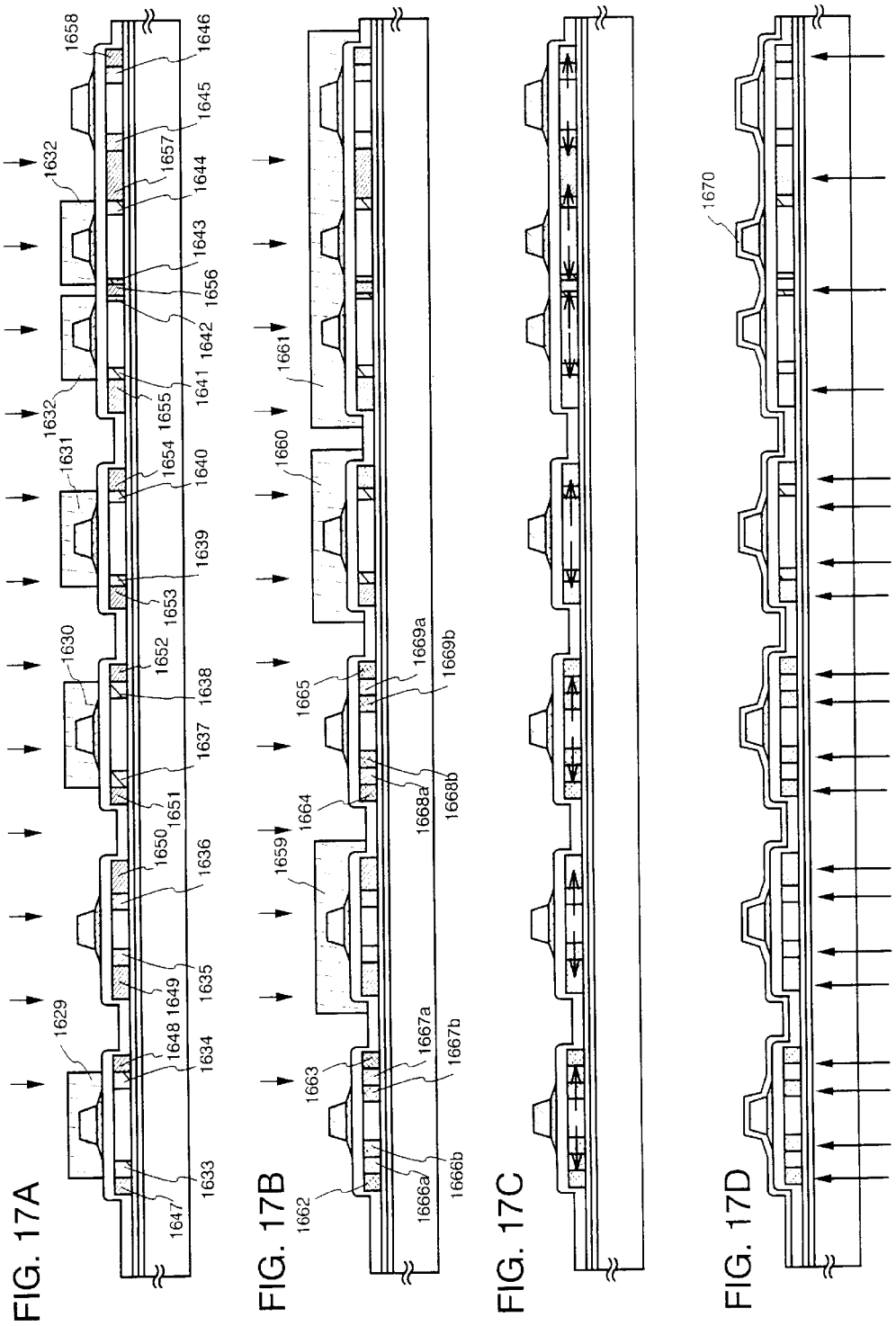

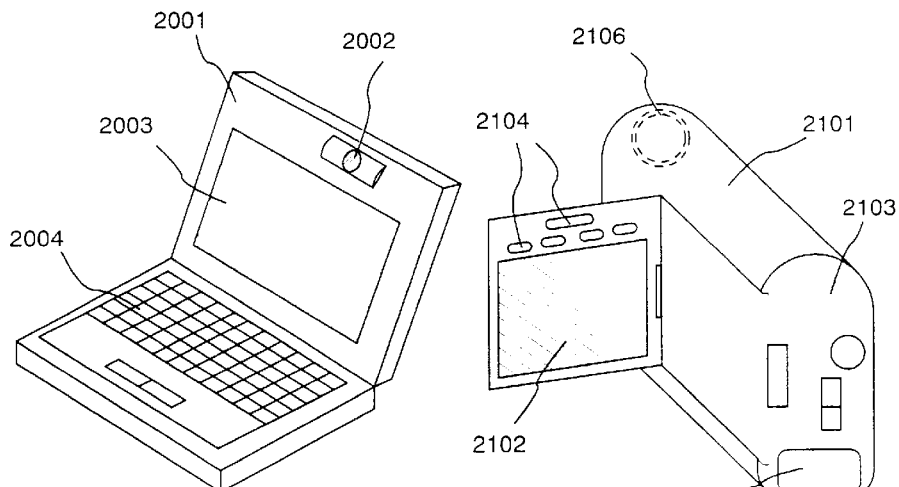
FIG. 19A
FIG. 19B
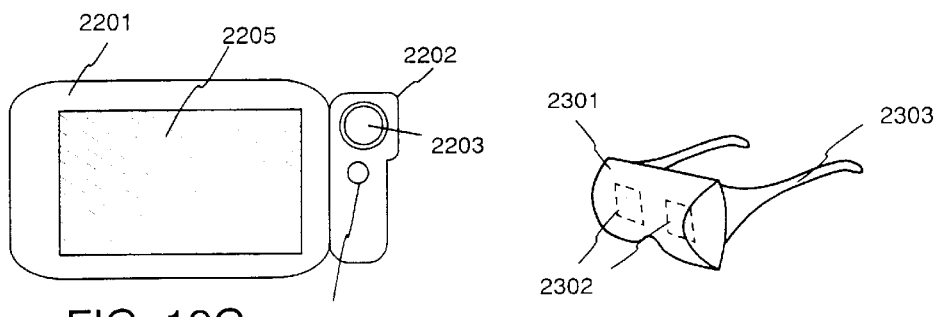
FIG. 19C
FIG. 19D
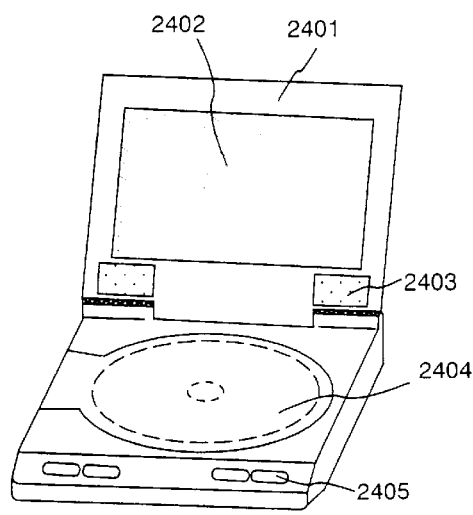
FIG. 19E
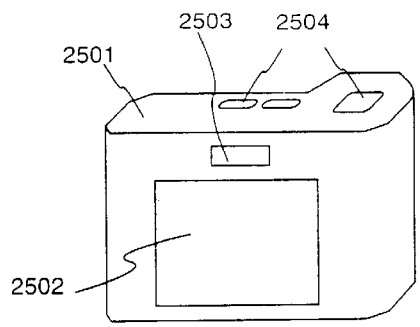
FIG. 19F

SEMICONDUCTOR DEVICE AND METHOD OF MANUFACTURING THE SAME

BACKGROUND OF THE INVENTION

1. Field of the Invention

The present invention relates to a method of manufacturing a semiconductor device by using a gettering technique, and to a semiconductor device obtained by the manufacturing method. More particularly, the present invention relates to a method of manufacturing a semiconductor device using a crystalline semiconductor film formed by adding a metallic element that catalyzes crystallization of a semiconductor film, and to a semiconductor device obtained by the manufacturing method.

In this specification, "semiconductor device" refers to all devices capable of functioning by using semiconductor characteristics, including all electro-optical devices, semiconductor circuits and electronic devices.

2. Description of the Related Art

Thin film transistors (hereinafter referred to as TFT) are known as a typical semiconductor device using a semiconductor film of a crystalline structure (hereinafter referred to as crystalline semiconductor film). TFT manufacturing techniques attract attention as techniques for forming an integrated circuit on an insulating substrate formed from glass or the like. Projects to put driver circuit-integrated liquid crystal display devices, etc., into practical use are being advanced. Crystalline semiconductor films are being formed by a process based on conventional techniques, i.e., a process in which an amorphous semiconductor film deposited by plasma chemical vapor deposition (plasma CVD) or low-pressure CVD is processed by heat treatment or laser annealing (a technique for crystallizing a semiconductor film by irradiation with laser light).

A crystalline semiconductor film formed in this manner is an aggregate of a multiplicity of crystal grains, and the crystal orientation thereof is random and cannot be controlled. This randomness is a factor which limits characteristics of TFTs. In view of this problem, techniques described below are taken into consideration. Japanese Patent Application Laid-open No. 7-183540 discloses a technique for making a crystalline semiconductor film by adding to a film material a metallic element such as nickel which catalyzes crystallization of a semiconductor film. This technique not only has the effect of reducing the heating temperature necessary for crystallization but also improves orientation of the crystal orientation in one direction. If a TFT is formed by using a crystalline semiconductor film formed by this technique, a reduction in subthreshold factor (S-value) is achieved as well as an improvement in field-effect mobility, thus remarkably improving electrical characteristics.

However, since this technique comprises adding a metallic element capable of catalytic action, it entails a problem in that such a metallic element remains in a crystalline semiconductor film or on the film surface and causes variations in characteristics of devices obtained from the film. For example, the off current in a TFT is increased and variation in off current occurs between the respective devices. That is, a metallic element which catalyzes crystallization becomes a hindrance rather than a necessary material once a crystalline semiconductor is formed.

Gettering using phosphorus is effectively used as a means for removing such a metallic element from a particular portion of a crystalline semiconductor film. For example, it is possible to easily remove such a metallic element from a channel region of a TFT in such a manner that phosphorus is added to a source-drain region of the TFT and heat treatment at 450 to 700° C. is performed.

Phosphorus is implanted into a crystalline semiconductor film by ion doping (a method of implanting ions into a semiconductor by dissociating PH or the like in plasma and by accelerating ions by an electric field, i.e., a method which basically excludes mass separation of ions). The concentration of phosphorus necessary for gettering is $1 \times 10^{20}/cm^3$ or higher. Addition of phosphorus by ion doping causes amorphization of the crystalline semiconductor film, and recrystallization of the semiconductor film is then performed by annealing. There is a problem of an impediment to the recrystallization due to an increased concentration of phosphorus. Also, addition of phosphorus at a high concentration leads to an increase in the processing time required for doping and, hence, a reduction in throughput of the doping step.

SUMMARY OF THE INVENTION

An object of the present invention is to provide, as a means for solving the above-described problems, a technique for effectively removing from a crystalline semiconductor film a metallic element remaining in the film, which has the effect of catalyzing crystallization of a semiconductor film, and which has been used to obtain the crystalline semiconductor film.

Gettering techniques are ranked as key techniques among techniques for manufacturing integrated circuits by using monocrystal silicon wafers. Gettering is known as a technique in which segregation of a metallic impurity taken into a semiconductor is caused at a gettering site by some energy to reduce the impurity concentration in an active region of a device. Gettering is broadly divided into two kinds: extrinsic gettering and intrinsic gettering. Extrinsic gettering produces a gettering effect by externally causing a strain field or chemical action. Phosphorus gettering by diffusing phosphorus through the back surface of a monocrystal silicon wafer so that the concentration of phosphorus is high falls within this category. Also, the above-mentioned gettering using phosphorus on a crystalline semiconductor film can be regarded as a kind of extrinsic gettering.

On the other hand, intrinsic gettering is known as a technique using a strain field of a lattice defect in a monocrystal silicon wafer which oxygen generated in the wafer concerns. The present invention has been achieved by focusing attention to such intrinsic gettering using a lattice defect or lattice strain. To apply such gettering to a crystalline semiconductor film having a thickness of about 10 to 100 nm, means described below are adopted.

The present invention comprises a process in which a rare gas element is added to a crystalline semiconductor thin film to form a gettering site, and a process for performing heat treatment on the semiconductor thin film. A metal contained in the crystalline semiconductor thin film is moved by the heat treatment to be captured at the gettering site (a region into which ions of the rare gas element have been added), thus removing or reducing the metal in the region of the crystalline semiconductor thin film other than the gettering site. The crystalline semiconductor thin film may be irradiated with strong light instead of undergoing ordinary heat treatment or may be simultaneously processed by ordinary heat treatment and irradiation with strong light.

The present invention is also characterized by placing a gettering site at a sufficient distance from a channel region in a TFT, considering the fact that a strong electric field is liable to concentrate in the vicinity of an end of a gate electrode, i.e., the boundary on the channel region when the TFT is driven.

As a method of adding a rare gas element, ion doping or ion implantation may be used. As a rare gas element used in accordance with the present invention, one of or two or more of He, Ne, Ar, Kr, and Xe may be selected. It is preferable to use Ar as a low-priced gas among these elements. If ion doping is performed, the concentration of one rare gas element contained in a doping gas is set to 30% or higher and, preferably, to 100%. For example, a doping gas having a Kr gas concentration of 30% and an Ar gas concentration of 70% may be used.

According to one aspect of the present invention disclosed in this specification, there is provided a semiconductor device comprising: an insulating film; an electrode; a channel region which overlaps the electrode with the insulating film interposed therebetween; a first impurity region which is adjacent to the channel region and which contains an impurity element imparting one conductivity type; and a second impurity region which is adjacent to the first impurity region, and which contains a metallic element, a rare gas element, and an impurity element imparting one conductivity type.

In the above-described structure, it is characterized in that the electrode is a gate electrode which partially overlaps the first impurity region with the insulating film interposed therebetween. An example thereof is illustrated in FIG. 1.

As another example of the above-described structure, FIG. 8 shows an example in which it is characterized in that the gate electrode covers the entire area of the first impurity region with the insulating film interposed therebetween. Specifically, in the example shown in FIG. 8, it is characterized in that the second impurity region is formed in a self-alignment manner.

Further, in each of the above-described structures, it is characterized in that the concentration of the impurity element imparting one conductivity type contained in the second impurity region is higher than the concentration of an impurity element imparting one conductivity type contained in the first impurity region.

Further, in each of the above-described structures, it is characterized in that the rare gas element is one element or a plurality of elements selected from the group consisting of He, Ne, Ar, Kr, and Xe.

Further, in each of the above-described structures, it is characterized in that the impurity element of the one conductivity type belongs to Group 15 or Group 13 in the periodic table.

To realize the above-described structure, according to another aspect of the present invention, there is provided a method of manufacturing a semiconductor device, including: a first step of adding a metallic element to a semiconductor film having an amorphous structure; a second step of crystallizing the semiconductor film to form a semiconductor film having a crystalline structure; a third step of forming an insulating film on the semiconductor film; a fourth step of forming an electrode on the insulating film so that the electrode overlaps the semiconductor film; a fifth step of selectively adding a rare gas element to the semiconductor film by using the electrode as a mask, and forming a second impurity region in the semiconductor film in a self-alignment manner by selectively adding an impurity element imparting one conductivity type; a sixth step of forming a gate electrode having a tapered portion by etching the electrode; a seventh step of forming a first impurity region by selectively adding the impurity element imparting one conductivity type to the semiconductor film through the tapered portion; and an eighth step of selectively removing or reducing the metallic element in the semiconductor film having the crystalline structure by gettering the metallic element into the second impurity region.

According to still another aspect of the present invention, there is provided a method of manufacturing a semiconductor device, including: a first step of adding a metallic element to a semiconductor film having an amorphous structure; a second step of crystallizing the semiconductor film to form a semiconductor film having a crystalline structure; a third step of forming a first impurity region in the semiconductor film having the crystalline structure by selectively adding an impurity element imparting one conductivity type to the semiconductor film; a fourth step of selectively adding a rare gas element to the semiconductor film having the crystalline structure, and forming a second impurity region in the semiconductor film by selectively adding the impurity element imparting one conductivity type to the semiconductor film; and a fifth step of selectively removing or reducing the metallic element in the semiconductor film having the crystalline structure by gettering the metallic element into the second impurity region.

In the above manufacturing method, the fourth step may comprise providing as a raw material gas a gas containing phosphine, and adding the phosphorus element and the rare gas element to the semiconductor film in the same step.

Further, in the above manufacturing method, the fourth step may comprise providing as a raw material gas a hydrogen gas containing phosphine, adding the phosphorus element to the semiconductor film, and then adding the rare gas element to the semiconductor film by using a rare gas as a raw material gas, without exposure to the atmosphere.

Also, one of or two or more of H, $H_2$, O, and $O_2$ may be selected to be added in addition to the rare gas element in the above-described step. In such a case, the step may be performed in an atmosphere containing the rare gas element and water vapor.

According to still another aspect of the present invention disclosed in this specification, there is provided a semiconductor device having, as illustrated in FIG. 18 by way of example, a pixel portion 1702 and a driver circuit 1701 provided on one insulating surface, wherein the driver circuit has n-channel TFTs 1706 and 1708, and p-channel TFTs 1705 and 1708, and a pixel TFT (n-channel TFT 1709) connected to a pixel electrode of the pixel portion has a semiconductor layer including a channel region 1687, a first impurity region (low-concentration impurity regions 1641 to 1644) adjacent to the channel region, and a second impurity region (high-concentration impurity regions 1655 to 1657) adjacent to the first impurity region.

In the above structure, it is characterized in that a gate electrode of the pixel TFT has a tapered portion, and the tapered portion overlaps with a part of the first impurity region. In addition, the second impurity region of the pixel TFT is formed by using a mask.

Further, in the above structure, a gate electrode of the n-channel TFT 1706 of the above-described driver circuit has a tapered portion, and the tapered portion overlaps with the entirety of the first impurity region. In addition, the second impurity region of the n-channel TFT 1706 of the above-described driver circuit is formed in a self-alignment manner.

Further, in each of the above-described structures, it is characterized in that the second impurity region contains a metallic element, a rare gas element, and an impurity element imparting one conductivity type.

Further, to realize the above-described arrangement, according to another aspect of the present invention, there is provided a method of manufacturing a semiconductor device having a pixel portion and a driver circuit provided on one insulating surface, comprising:

a first step of adding a metallic element to a semiconductor film having an amorphous structure;

a second step of crystallizing the semiconductor film to form a semiconductor film having a crystalline structure;

a third step of forming an insulating film on the semiconductor film:

a fourth step of forming an electrode on the insulating film so that the electrode overlaps the semiconductor film and has a tapered portion;

a fifth step of forming a first impurity region by selectively adding an impurity element imparting one conductivity type to the semiconductor film through the tapered portion of the electrode;

a sixth step of selectively forming a second impurity region containing the impurity element imparting one conductivity type and a rare gas element in the semiconductor film in the pixel portion by providing a mask, and simultaneously forming a second impurity region in the driver circuit by using the electrode as a mask in a self-alignment manner; and a seventh step of selectively removing or reducing the metallic element in the semiconductor film having the crystalline structure by gettering the metallic element into the second impurity region.

Further, to realize the above-described arrangement, according to another aspect of the present invention, there is provided a method of manufacturing a semiconductor device having, as illustrated in FIG. 16 and FIG. 17 by way of example, a pixel portion and a driver circuit provided on one insulating surface, comprising:

a first step of adding a metallic element to a semiconductor film having an amorphous structure;

a second step of crystallizing the semiconductor film to form a semiconductor film having a crystalline structure;

a third step of forming an insulating film 1697 on the semiconductor film;

a fourth step of forming electrodes 1622 to 1627 on the insulating film each overlapping the semiconductor film and having a tapered portion;

a fifth step of forming a first impurity region 1628 in the semiconductor film by selectively adding an impurity element imparting one conductivity type to the semiconductor film by using the electrode as a mask:

a sixth step of selectively forming second impurity regions 1655 to 1657 containing the impurity element imparting one conductivity type and a rare gas element in the pixel portion by forming a mask 1632, and simultaneously forming second impurity regions 1649 and 1650 in the driver circuit by using the above-described electrode 1623 as a mask in a self-alignment manner, and forming third impurity regions 1635 and 1636 between the second impurity regions 1649 and 1650 and the channel region 1684 in the driver circuit by causing the impurity to pass through the tapered portion of the above-described electrode; and a seventh step of selectively removing or reducing the metallic element in the semiconductor film having the crystalline structure by gettering the metallic element in the second impurity regions 1647 to 1658.

In the above-described structure, the impurity concentration in the third impurity region is lower than that in the second impurity region and has a concentration gradient along the channel length direction according to the tapered shape of the tapered portion of the electrode, because the third impurity region is formed by adding the impurity through the tapered portion of the electrode. In the sixth step of the above-described structure, the impurity element imparting one conductivity type and the rare gas element may be added successively or may be added at a time in the same step. If they are successively added, and if the conditions for addition are such that the rare gas element does not pass through the tapered portion when added, the rare gas element is not added to the third impurity region and can be added only to the second impurity region.

In this specification, a low-concentration impurity region ($n^{--}$ region) is referred to as a first impurity region, a low-concentration impurity region ($n^-$ region) is referred to as a third impurity region, and a high-concentration impurity region (n+region) is referred to as a second impurity region.

BRIEF DESCRIPTION OF THE DRAWINGS

In the accompanying drawings:

FIGS. 1A to 1F are diagrams showing a TFT manufacturing process (Embodiment Mode 1);

FIG. 6 is a diagram showing a manufacturing process of an active matrix substrate;

FIGS. 9A to 9C are diagrams showing a manufacturing process of an active matrix substrate;

FIGS. 10A to 10D are diagrams showing a manufacturing process of an active matrix substrate;

FIGS. 16A to 16C are diagrams showing a manufacturing process of an active matrix substrate;

FIGS. 17A to 17D are diagrams showing a manufacturing process of an active matrix substrate;

FIGS. 19A to 19F are diagrams showing examples of electronic devices;

DESCRIPTION OF THE PREFERRED EMBODIMENTS

Figure 2A:
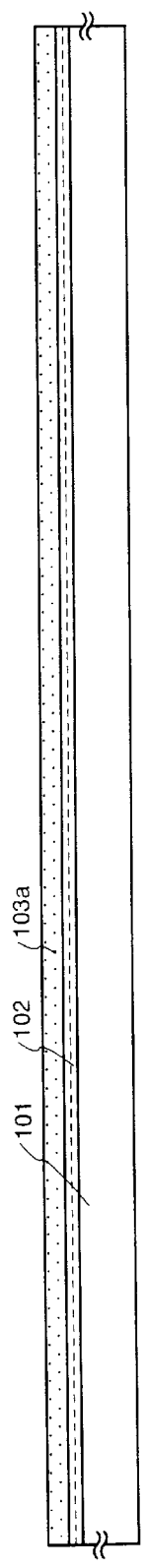
FIGS. 2A to 2D are diagrams showing a manufacturing process of an active matrix substrate.

Embodiment modes of the present invention will be described below.

[Embodiment Mode 1]

A channel region and regions in the vicinities of the boundaries of the channel region in an active layer of a TFT are important portions which influence electrical characteristics of the TFT. It is desirable to exclude impurities therefrom as completely as possible. Also, nickel silicide segregates easily at the boundaries of a region containing an added rare gas element (gettering site). The most important feature of the present invention resides in placing the boundary of this region at a position apart from the channel region. FIGS. 1A to 1F show an example of a process in which an n-channel TFT is manufactured by setting the position of a gettering site with a mask formed from a resist.

Referring to FIG. 1A, a transparent substrate 10, which may be formed from barium borosilicate glass, alumino-borosilicate glass, or quartz, is provided. An inorganic insulating film is first formed as a blocking layer 11 with a thickness of 10 to 200 nm on the surface of the substrate 10. A preferred example of the blocking layer is a silicon oxynitride film formed by plasma CVD in such a manner that a first silicon oxynitride film formed from $SiH_4$, $NH_3$, and $N_2O$ is formed with a thickness of 50 nm, and a second silicon oxynitride film formed from $SiH_4$ and $N_2O$ is formed with a thickness of 100 nm. The blocking layer 11 is provided for the purpose of preventing any alkali metal contained in the glass substrate from diffusing into a semiconductor film formed as a layer on the glass substrate. If the substrate is made of quartz, it is not necessary to form the blocking layer 11.

The semiconductor layer is next formed on the blocking layer 11. The semiconductor layer is formed by a process in which a semiconductor film of an amorphous semiconductor structure is formed by a well-known means (sputtering, LPCVD, or plasma CVD), the formed film is processed by a well-known crystallization processing (laser crystallization, thermal crystallization, thermal crystallization using a catalyst such as nickel, or the like) to obtain a crystalline semiconductor film, and this crystalline semiconductor film is formed into a desired pattern by patterning using a photomask. In this process, crystallization is performed such that nickel is used as the catalyst, a layer containing the catalyst is formed on the entire surface or on a portion of the surface by application, sputtering, evaporation or plasma processing, and ordinary heat treatment or irradiation with strong light is subsequently performed. In this case, a silicide is formed in a semiconductor film portion in contact with the catalyst metallic element and crystallization progresses from nucleation of the suicide. This semiconductor layer is formed with a thickness of 25 to 80 nm (preferably 30 to 60 nm). There is no particular restriction on the selection of the material of the crystalline semiconductor film. However, it is preferred that the semiconductor film be formed of silicon or a silicon germanium (SiGe) alloy.

The crystalline semiconductor film may be irradiated with laser light to further increase the crystallization rate (the proportion of the crystalline component to the total volume of the film) in order to repair defects remaining in crystal grains. This laser light may be excimer laser light having a wavelength of 400 nm or less, or the second or third harmonic of a YAG laser. In any case, laser processing on the crystalline semiconductor film may be performed by using pulsed laser light having a repetition frequency of about 10 to 1000 Hz, by condensing the laser light to 100 to 400 $J/cm^2$ by means of an optical system, and by setting the overlap ratio to 90 to 95%.

While an example of irradiation with pulsed laser light has been described, continuously oscillated laser light may alternatively be used. To obtain large-grain crystals in crystallization of an amorphous semiconductor film, it is preferable to use a solid-state laser capable of continuous oscillation and to apply some of the second to fourth harmonics of the fundamental wave. Typically, the second harmonic (532 nm) or the third harmonic (355 nm) of a $Nd:YVO_4$ laser (fundamental wave: 1064 nm) may be applied. In a case where continuously oscillated laser light is used, laser light emitted from a continuous-oscillation $YVO_4$ laser having an output power of 10 W is converted into a harmonic by a nonlinear optical element. A method of emitting a harmonic by setting a $YVO_4$ crystal and a nonlinear optical element in a resonator may alternatively be used. Preferably, the laser light with which the member to be processed is irradiated is shaped by an optical system so as to define a rectangular or elliptical irradiation area on the irradiated surface. The necessary energy density for this irradiation is about 0.01 to 100 $MW/cm^2$ (preferably 0.1 to 10 $MW/cm^2$). The semiconductor film may be irradiated with the laser light while being moved at a speed of about 10 to 2000 cm/s relative to the laser light.

While the technique in which thermal crystallization using nickel as a metallic element for promoting crystallization of silicon is performed and irradiation with laser light is then performed has been described, amorphous silicon film may be crystallized by continuously oscillated laser light (the second harmonic of a $YVO_4$ laser) without adding nickel.

Next, an insulating film 14 which covers the semiconductor layer is formed. The insulating film 14 is formed as a single layer or a multilayer structure of insulating film having a thickness of 40 to 150 nm and containing silicon by using plasma CVD or sputtering. This insulating film 14 is used as a gate insulating film.

Subsequently, a mask 15 is formed from a resist to cover a region of the semiconductor layer which will become a channel region 13a. An impurity element (a dopant, which is phosphorus in this process) imparting one conductivity type in the semiconductor layer is then added to a low concentration through the insulating film 14. $P^-$ regions 12a are thereby formed (FIG. 1A). Part of the $P^-$ regions 12a functions as a lightly doped drain (LDD) region.

The mask 15 is thereafter removed and an electrode 16 is formed so as to partially overlaps on the $P^-$ regions 12a (FIG. 1B). A single layer or a multilayer structure of an element selected from the group consisting of Ta, W, Ti, Mo, Al, Cu, Cr, and Nd, or an alloy material or a compound material containing some of these elements as a main constituent may be used as the electrode 16. A semiconductor film typified by polycrystalline silicon film doped with an impurity element such as phosphorus may alternatively be used. This electrode 16 functions as a gate electrode.

Subsequently, a mask 17 is formed from a resist, a rare gas element (Ar) is added to the semiconductor layer through the insulating film 14, and an impurity element (phosphorus) imparting one conductivity type in the semiconductor layer is then added to a high concentration, thereby forming $P^++Ar$ regions 18 (FIG. 1C). As the rare gas element, one of or two or more of He, Ne, Ar, Kr, and He may be selected to be used. It is preferable to use Ar as a low-priced gas among these elements. Ion doping or ion implantation may be performed to add the rare gas element. Argon may be added after addition of phosphorus. It is desirable that doping with phosphorus and doping with argon be continuously performed by being isolated from the atmosphere. A gas containing the dopant and the rare gas element may be used as a raw material gas to add both the dopant and the rate gas element in the same step. The P$^+$+Ar regions 18 function as a gettering site in a gettering step performed afterward. A P$^-$ region 12*b* is formed between the channel region 13*a* and the P$^+$+Ar regions 18.

The mask 17 is thereafter removed and gettering is performed. Heat treatment in a nitrogen atmosphere at 450 to 800° C. for 1 to 24 hours, more specifically at 550° C. for 4 hours may be performed for this gettering, whereby the metallic element is caused to move in the directions of arrows 19 in FIG. 1D, i.e., from a channel region 13*b* to the gettering sites 18. This gettering also has an annealing effect. By this gettering, the metallic element contained in the semiconductor film covered with the insulating layer 14, particularly in the channel region 13*b* is removed or the concentration of the metallic element is reduced. By this gettering, the metallic element contained in the P$^-$ regions 12*b* is also removed or the concentration of the metallic element is reduced. In this gettering step, a synergetic effect of gettering with the rare gas element and gettering with phosphorus can be obtained by selecting processing conditions. Irradiation with strong light may be performed instead of ordinary heat treatment. Also, irradiation with strong light may be performed in addition to ordinary heat treatment. However, in a case where a rapid thermal annealing (RTA) method using light emitted from a halogen lamp, a metal halide lamp, a xenon arc lamp, a carbon arc lamp, a high-pressure sodium lamp, or a high-pressure mercury lamp is used as a gettering heating means, it is desirable that the semiconductor film be heated with strong light so that the temperature at which the semiconductor film is heated is 400 to 550° C. If the heating temperature is excessively high, strain in the semiconductor film is eliminated and the effect of causing nickel to spring out of the gettering site (nickel silicide) and the effect of capturing nickel are lost, so that the gettering efficiency is reduced.

The above-described gettering allows the metallic element to easily segregate in the vicinity of the boundaries between the P$^-$ regions 12*b* and the P$^+$+Ar regions 18. However, the electrical characteristics, reliability, etc., of the TFT are not affected by this segregation since the boundaries are spaced apart from the channel region 13*b*.

Heat treatment, irradiation with strong light, or irradiation with laser light may subsequently be performed to activate the dopant. Simultaneously with activation of the dopant, restoration of the gate insulating film and the interface between the gate insulating film and the semiconductor layer from plasma damage can be performed. In this restoration, activation of the dopant by irradiation with the second harmonic of a YAG laser through the surface or back surface in an atmosphere at a temperature within the range from room temperature to 300° C. is particularly effective. A YAG laser is preferred because it is easily maintained. If activation of the dopant can be performed in the preceding gettering step, it may be performed simultaneously with gettering.

In subsequent steps, interlayer insulating films 20*a* and 20*b* are formed, hydrogenation is performed to form contact holes reaching the P$^+$+Ar regions 18. and a source electrode 21 and a drain electrode 22 are respectively formed, thereby completing the TFT.

In comparison with gettering using phosphorus, the effect of gettering based on addition of the rare gas element in accordance with the present invention is high. Moreover, since the rare gas element can be added to a high concentration of, for example, $1 \times 10^{20}$ to $5 \times 10^{21}/cm^3$, the amount of the metallic element added for crystallization can be increased. That is, the processing time required for crystallization can be reduced by increasing the amount of the metallic element added for crystallization. If the processing time required for crystallization is not changed, the amount of the metallic element added for crystallization may be increased to enable crystallization at a lower temperature. Also, the amount of the metallic element added for crystallization may be increased to limit natural nucleation, thereby enabling formation of the satisfactory crystalline semiconductor film.

Also, the rare gas element can be added to the semiconductor film to a high concentration in a short time, e.g., about one or two minutes. Therefore, the throughput can be remarkably improved in comparison with gettering using phosphorus.

The present invention is not limited to the above-described step order (formation of P$^-$ region→formation of gate electrode→formation of P$^+$+Ar region). Step order of P$^-$ region formation→P$^+$+Ar region formation→gate electrode formation, or step order of P$^+$+Ar region formation→P$^-$ region formation→gate electrode formation may be selected. Also, step order of P$^+$+Ar region formation→P$^-$ region formation→gettering→activation→gate electrode formation may be selected. If the gate electrode is formed after gettering as in this order, the material of the gate electrode can be selected from various materials. For example, a low-resistance material (Cu. Al, Ag, Au, or the like) susceptible to heating at a high temperature may be used to form the gate electrode.

[Embodiment Mode 2]

FIG. 8 shows an example of a process in which addition of a rare gas element or a dopant to a high concentration is performed in a self-alignment manner by using electrodes as a mask, the electrodes are then etched so as to form a tapered portion, and the dopant is added to a low concentration through the tapered portion to form LDD regions facing the tapered portion.

An insulating film 34 is formed, as is that in Embodiment Mode 1. A blocking layer 31 and a semiconductor layer are formed on a substrate 30, and the insulating film 34 is formed. Crystallization is performed by using nickel, as is that in Embodiment Mode 1.

Thereafter, a first conductive film having a thickness of 20 to 100 nm and a second conductive film having a thickness of 100 to 400 nm are laminated on the insulating film 34.

Subsequently, a mask 35*a* is formed from a resist by photolithography, and first etching for forming electrodes 36*a* and 37*a* is performed. As a first etching condition, an inductivity coupled plasma (ICP) etching method is used.

Figure 8A:
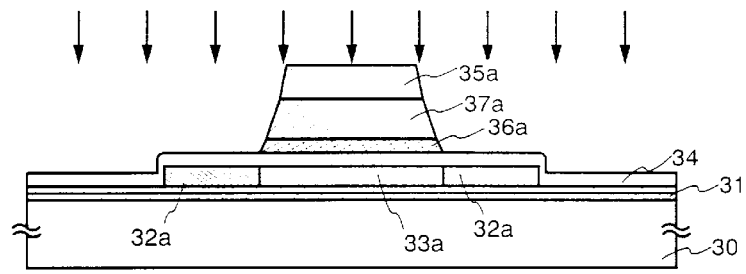
FIGS. 8A to 8F are diagrams showing a TFT manufacturing process (Embodiment Mode 2)
Figure 8B:
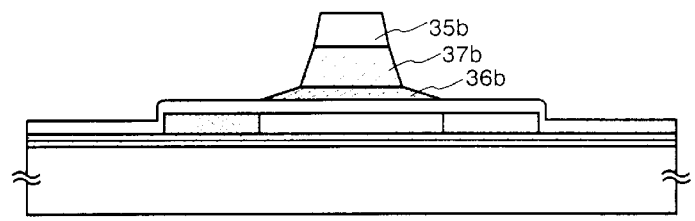
Figure 8C:
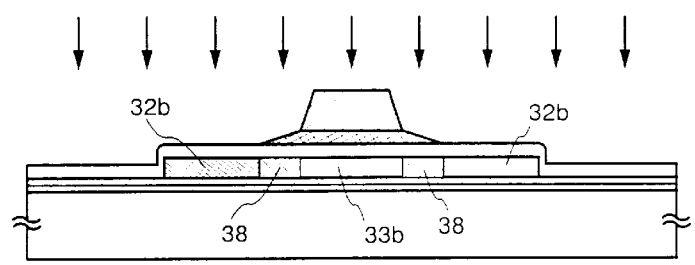
Figure 8D:
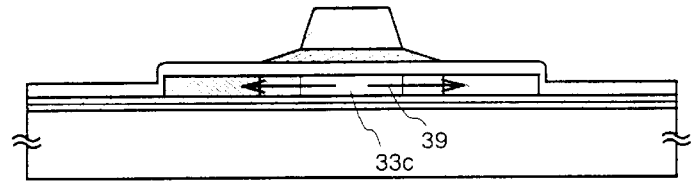
Figure 8E:
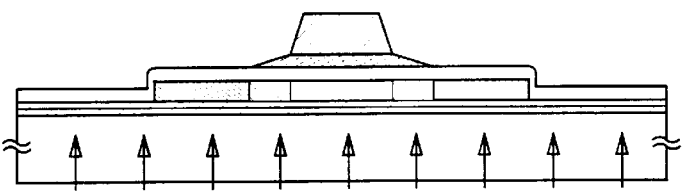
Figure 8F:
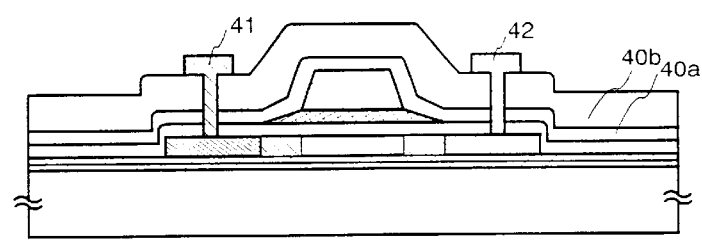
Figure 11:
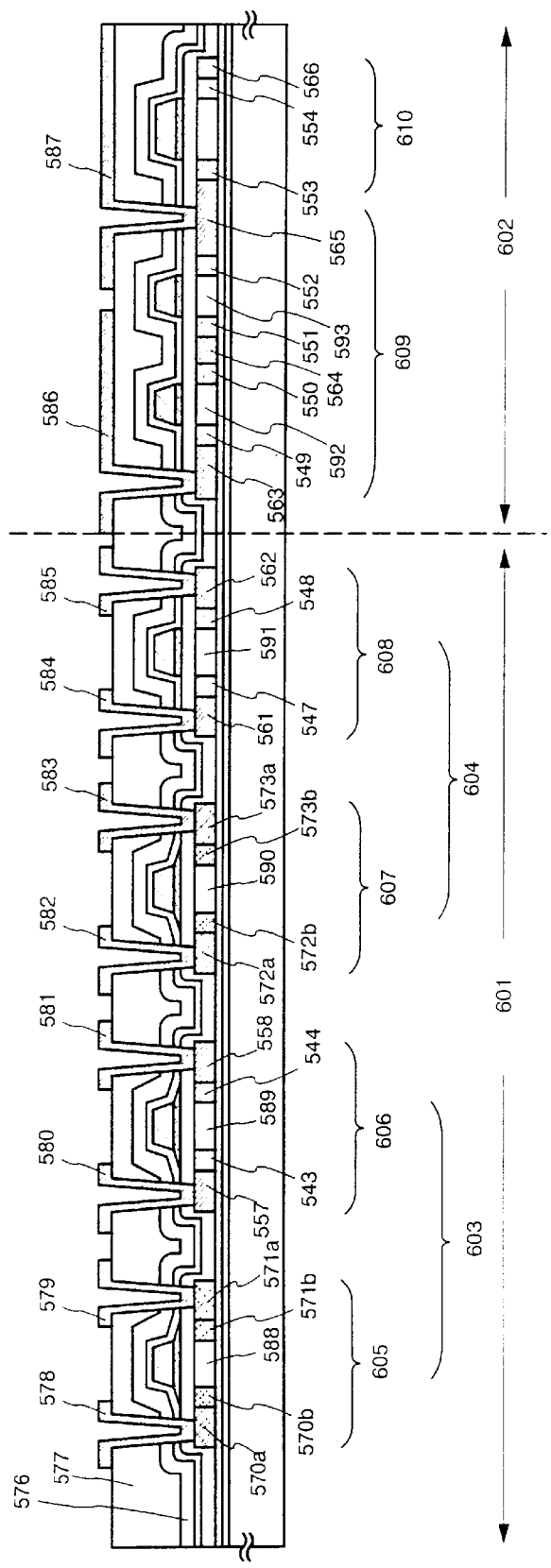
FIG. 11 is a diagram showing a manufacturing process of an active matrix substrate.

First doping is then performed by using electrodes 36*a* and 37*a* as a mask without removing the mask 35*a*. In the first doping, a rare gas element (Ar) is added to the semiconductor layer through the insulating film 34 and an impurity element (phosphorus) for imparting one conductivity type in the semiconductor layer is subsequently added to a high concentration, thereby forming P$^+$+Ar regions 32*a* (FIG. 8A). The region not doped is indicated by 33*a*.

Figure 5A:
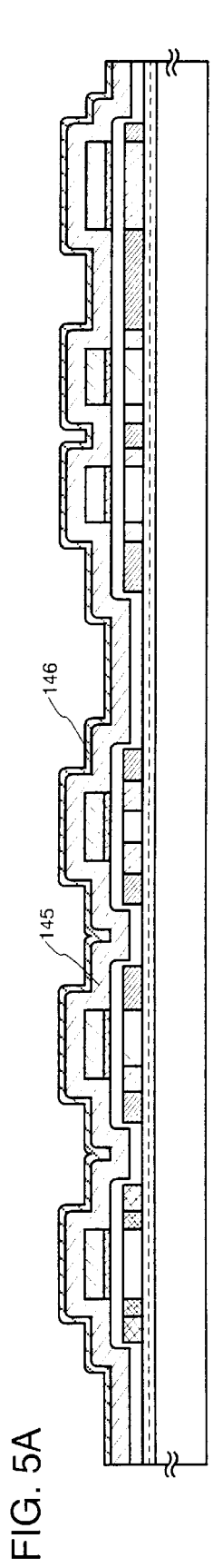
FIGS. 5A to 5C are diagrams showing a manufacturing process of an active matrix substrate.
Figure 5B:
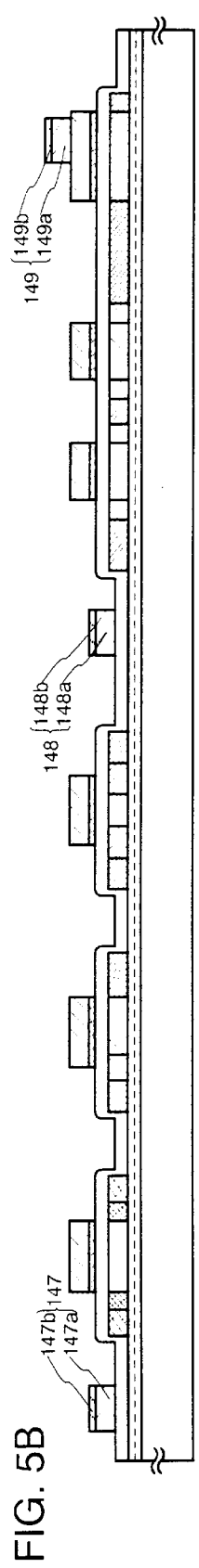

Subsequently, second etching is performed while the mask 35*a* is left. Part of the second conductive layer is thereby removed to form an electrode 37*b*. The mask 35*a* is also etched by the second etching to form a mask 35b. On the other hand, the first conductive layer is etched only to a small extent to form an electrode 36b having a tapered portion of a small taper angle (FIG. 5B).

Figure 5C:
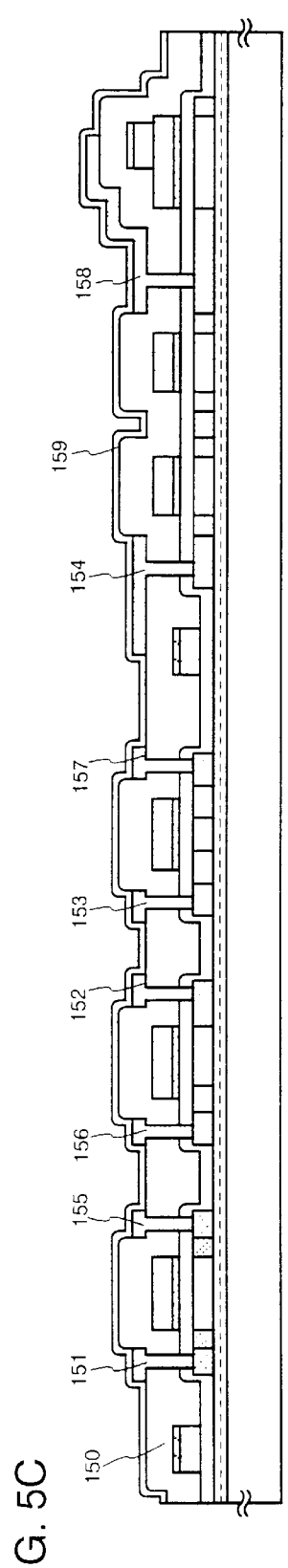

The mask 35b is thereafter removed, second doping is then performed to obtain the state shown in FIG. 5C. This doping is performed by using the electrode 37b as a mask against the impurity element so that the impurity element is added to the semiconductor layer below the tapered portion of the electrode 36b. Thus, P$^-$ regions 38 facing the electrode 36b is formed in a self-alignment manner. In the second doping, the P$^+$+Ar regions 32a are also doped to form P$^+$+Ar regions 32b. The region not doped (which will become a channel region) is indicated by 33b.

Subsequently, gettering is performed. Heat treatment in a nitrogen atmosphere at 450 to 800° C. for 1 to 24 hours, more specifically at 550° C. for 14 hours may be performed for this gettering, whereby the metallic element is caused to move in the directions of arrows 39 in FIG. 8D, i.e., from a channel region 33c to the gettering sites 32b. By this gettering, the metallic element contained in the semiconductor film covered with the insulating layer 34, particularly in the channel region 33c is removed or the concentration of the metallic element is reduced. By this gettering, the metallic element contained in the P$^-$ regions 38b is also removed or the concentration of the metallic element is reduced. Irradiation with strong light may be performed instead of ordinary heat treatment. Also, irradiation with strong light may be performed in addition to ordinary heat treatment.

A heating treatment, irradiation with strong light, or irradiation with laser light may be subsequently performed to activate the dopant. Simultaneously with activation of the dopant, restoration of the gate insulating film and the interface between the gate insulating film and the semiconductor layer from plasma damage can be performed. In this restoration, activation of the dopant by irradiation with the second harmonic of a YAG laser with the surface or back surface in an atmosphere at a temperature within the range from room temperature to 300° C. is particularly effective. A YAG laser is preferred because it is easily maintained. If activation of the dopant can be performed in the preceding gettering step, it may be performed simultaneously with gettering.

In subsequent steps, interlayer insulating films 40a and 40b are formed hydrogenation is performed to form contact holes reaching the P$^+$+Ar regions 32b, and a source electrode 41 and a drain electrode 42 are respectively formed, thereby completing the TFT.

Etching for removing only the tapered portion of the electrode 36b may be performed to reduce the off current.

While use of one mask for high-concentration doping and for doping with the rare gas element has been described by way of example, another mask may be prepared and the two masks may be formed respectively for doping with the impurity element and doping with the rare gas element.

Each of Embodiment Modes 1 and 2 has been described with respect to the case where phosphorus is added to the semiconductor layer through the insulating film. However, phosphorus may be added after exposing part of the semiconductor layer by removing the insulating film.

Each of Embodiment Modes 1 and 2 has been described with respect to manufacture of an n-channel TFT. However, a p-channel TFT can also be manufactured by using boron instead of phosphorus.

In each of Embodiment Modes 1 and 2, the region in which a rare gas element is added is spaced apart from the channel region to prevent segregation of nickel silicide at the boundaries of the channel region.

The present invention characterized by the above-described arrangements will be described below in more detail with respect to embodiments thereof.

[Embodiment 1]

An embodiment of the present invention will be described with reference to FIGS. 2 through 6. A process in which pixel TFTs in a pixel portion of a device and TFTs in a driver circuit provided along the periphery of the pixel portion are manufactured on one substrate will be described in detail with respect to process steps. For ease of explanation, a CMOS circuit which is a basic circuit constituting a shift register circuit, a buffer circuit, etc., and an n-channel TFT forming a sampling circuit are illustrated as components of the driver circuit. The process of this embodiment corresponds to the manufacturing process in Embodiment Mode 1.

Referring to FIG. 2A, a low-alkali glass substrate or a quartz substrate may be used as a substrate 101. In this embodiment, a low-alkali glass substrate was used. The low-alkali glass substrate may be heat-treated in advance at a temperature about 10 to 20° C. lower than the strain point of the glass. A base film 102 such as a silicon oxide film, a silicon nitride film or a silicon oxynitride film is formed on the surface of the substrate 101 for formation of TFTs in order to prevent impurity diffusion from the substrate 101. For example, a silicon oxynitride film formed from SiH$_4$, NH$_3$, and N$_2$O is formed with a thickness of 100 nm, and similarly, another silicon oxynitride film formed from SiH$_4$ and N$_2$O is formed with a thickness of 200 nm.

Next, a semiconductor film 103a of an amorphous structure having a thickness of 20 to 150 nm (preferably 30 to 80 nm) is formed by a well-known method such as plasma CVD or sputtering. In this embodiment, an amorphous silicon film was formed with a thickness of 55 nm by plasma CVD. The semiconductor film having an amorphous structure may be an amorphous semiconductor film or a microcrystalline semiconductor film. A compound semiconductor film of an amorphous structure, e.g., an amorphous silicon germanium film may also be used. The base film 102 and the amorphous silicon film 103a can be formed by the same film forming method. Therefore these films may be successively formed by continuous processing. If these films are formed in this manner, by not exposing the processed surface to the atmosphere after the formation of the base film, contamination of the surface can be prevented to reduce variations in characteristics and threshold voltage of TFTs to be manufactured (FIG. 2A).

Figure 2B:
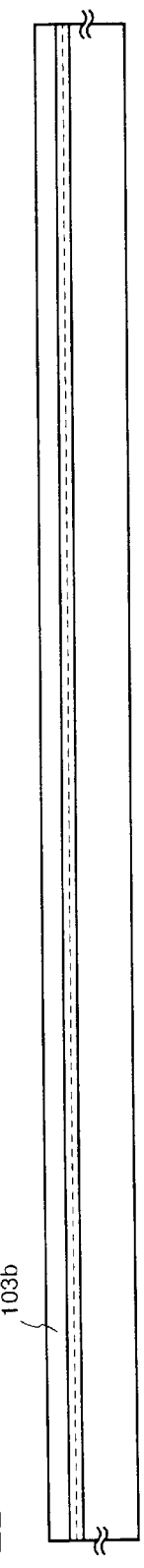

A crystalline silicon film 103b is formed from the amorphous silicon film 103a by using a well-known crystallization technique. For example, a laser crystallization method or a thermal crystallization method (solid phase growth method) may be used. In this embodiment, the crystalline silicon film 103b was manufactured by crystallization using a catalyst on the basis of the technique disclosed in Japanese Patent Application Laid-open No. 7-130652. It is desirable that heat treatment on an amorphous silicon film at 400 to 500° C. for about 1 hour, depending on the hydrogen content in the amorphous silicon film, be performed to reduce the hydrogen content to 5 atom % or less before the crystallization step. When the amorphous silicon film is crystallized, atoms in the film rearrange and compact together. Thus, the thickness of the crystalline silicon film formed in this manner was reduced by 1 to 15% from the original thickness of the amorphous silicon film (55 nm in this embodiment) (FIG. 2B).

Figure 2C:
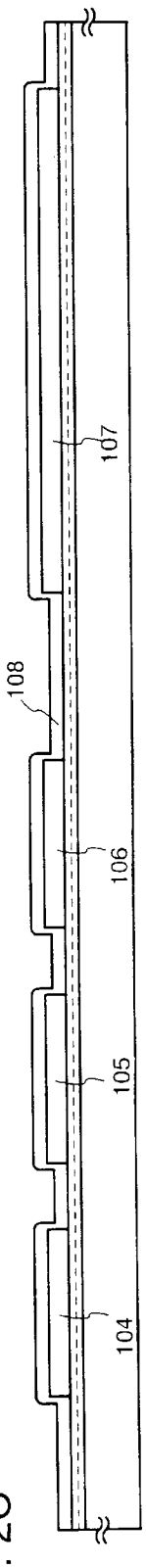

The crystalline silicon film 103b is divided in island-like shapes to form semiconductor layers 104 to 107. Thereafter, a mask layer 108 formed from a silicon oxide film having a thickness of 50 to 100 nm is formed by plasma CVD or sputtering (FIG. 2C).

Figure 2D:
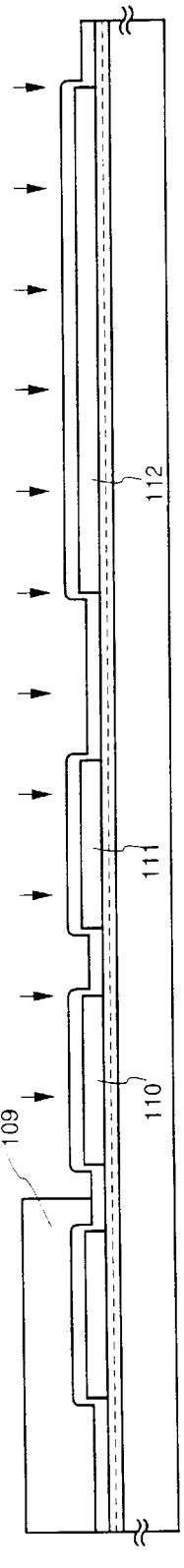

A resist mask 109 was also formed and Boron (B) selected as an impurity element for imparting a p-type conductivity was added to a concentration of about $1\times10^{16}$ to $5\times10^{17}$ atoms/cm$^3$ through the entire surfaces of the semiconductor layers 105 to 107 for forming n-channel TFTs for the purpose of controlling the threshold voltage. Boron (B) may be added by ion doping or may be added at the time of formation of the amorphous silicon film. Addition of boron (B) is not always necessary. However, it is preferable to form semiconductor layers 110 to 112 containing added boron (B) for the purpose of setting the threshold voltage of each n-channel TFT within a predetermined range (FIG. 2D).

Figure 3A:
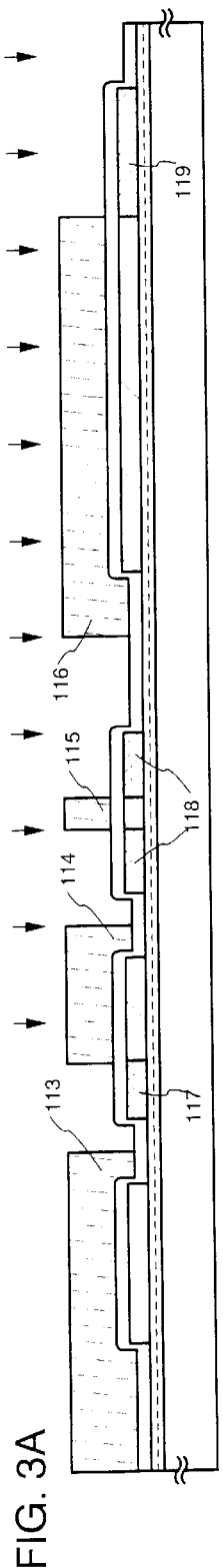
FIGS. 3A to 3D are diagrams showing a manufacturing process of an active matrix substrate.

An impurity element for imparting an n-type conductivity is added to selected portions of the semiconductor layers 110 and 111 to form LDD regions of driver circuit n-channel TFTs. To enable this, resist masks 113 to 116 are formed in advance. Phosphorus (P) or arsenic (As) may be added as an impurity element for imparting an n-type conductivity. In this embodiment, ion doping using a phosphine (PH$_3$) was performed to add phosphorus. The concentration of phosphorus (P) in formed impurity regions 117 and 118 may be set within the range from $2\times10^{16}$ to $5\times10^{19}$ atoms/cm$^3$. In this specification, the concentration of the impurity element contained in the formed impurity regions 117 to 119 to impart an n-type conductivity is represented as (n$^-$). The impurity region 119 is a semiconductor layer for forming a storage capacitor in the pixel portion. Phosphorus (P) was added to this region to the same concentration (FIG. 3A).

The mask layer 108 is thereafter removed by using fluoric acid or the like. step of activating the impurity element added in the step shown in FIG. 1D or in he step shown in FIG. 2A may be performed. This activation may be performed y a method using heat treatment in a nitrogen atmosphere at 500 to 600° C. for 1 to 4 hours or laser activation. Both of such heat treatment and laser activation may be performed.

Figure 3B:
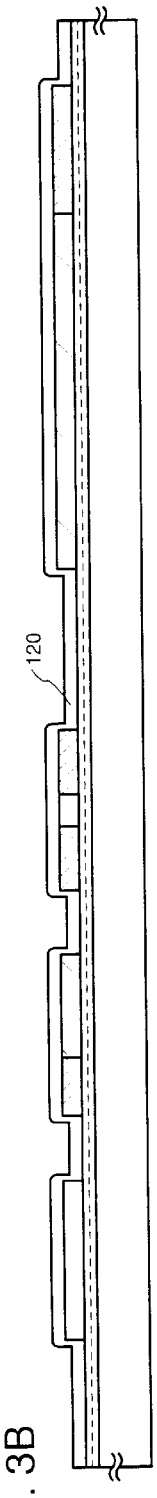

A gate insulating film 120 is then formed with a thickness of 10 to 150 nm as an insulating film containing silicon by plasma CVD or sputtering. For example, a silicon oxynitride film having a thickness of 120 nm is formed. A different single layer or a multilayer structure of insulating film containing silicon may be used as the gate insulating film (FIG. 3B).

Next, a first conductive film is formed in order to form gate electrodes. This first conductive layer may be formed as a single layer or a multilayer structure, e.g., a two-layer or three-layer structure as required. In this embodiment, a conductive layer (A) 121 formed of a conductive nitride metal film and a conductive layer (B) 122 formed of a conductive metal film were laminated. The conductive layer (B) 122 may be formed of film of an element selected from the group consisting of tantalum (Ta), titanium (Ti), molybdenum (Mo), and tungsten (W), an alloy containing the element as a main constituent or an alloy film obtained by combining some of these elements (typically a Mo—W alloy film or Mo—Ta alloy film). The conductive layer (A) 121 may be formed from tantalum nitride (TaN), tungsten nitride (WN), titanium nitride (TiN) or molybdenum nitride (MoN). As an alternative to the above-mentioned materials for the conductive layer (A) 121, tungsten silicide, titanium silicide or molybdenum silicide may be used.

Figure 3C:
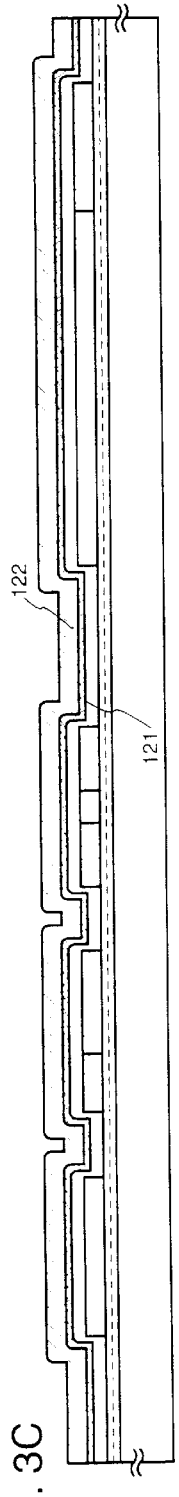

The thickness of the conductive layer (A) 121 may be set to 10 to 50 nm (preferably 20 to 30 nm), and the thickness of the conductive layer (B) 122 may be set to 200 to 400 nm (preferably 250 to 350 nm). In this embodiment, a tantalum nitride film having a thickness of 30 nm was used for the conductive layer (A) 121 and a Ta film having a thickness of 350 nm was used for the conductive layer (B) 122. Each film was formed by sputtering. In this step of forming the film by sputtering, the internal stress in the formed film may be reduced by adding a suitable amount of Xe or Kr to the Ar gas for sputtering to prevent separation of the film. It is effective to form a phosphorus (P)-doped silicon film having a thickness of 2 to 20 nm (not shown) under the conductive layer (A) 121 in improving the adhesion of this conductive film and in preventing oxidation of this film as well as in preventing any alkali metal element contained at a small concentration in the conductive layer (A) or conductive layer (B) from diffusing into the gate insulating film 120 (FIG. 3C).

Figure 3D:
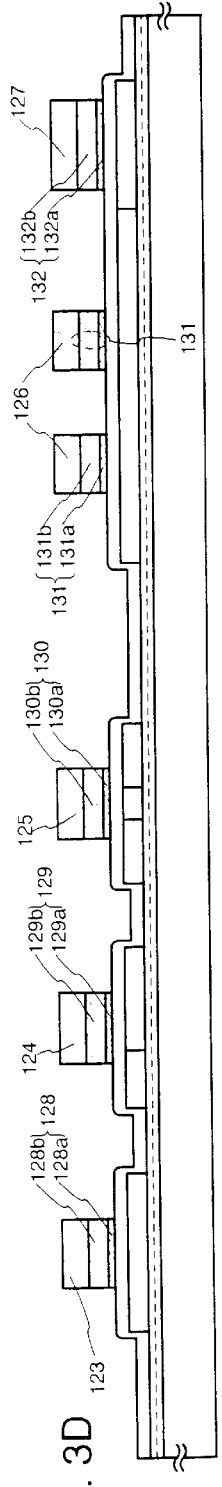

Subsequently, resist masks 123 to 127 are formed and the conductive layer (A) 121 and the conductive layer (B) 122 are simultaneously etched to form gate electrodes 128 to 131 and a capacitor wiring 132. Each of the gate electrodes 128 to 131 and the capacitor wiring 132 is integrally formed with the corresponding one of conductive layer (A) portions 128a to 132a and the corresponding one of conductive layer (B) portions 128b to 132b. The gate electrodes 129 and 130 in the driver circuit are formed so as to overlap parts of the impurity regions 117 and 118 through the gate insulating film 120 (FIG. 3D).

Figure 4A:
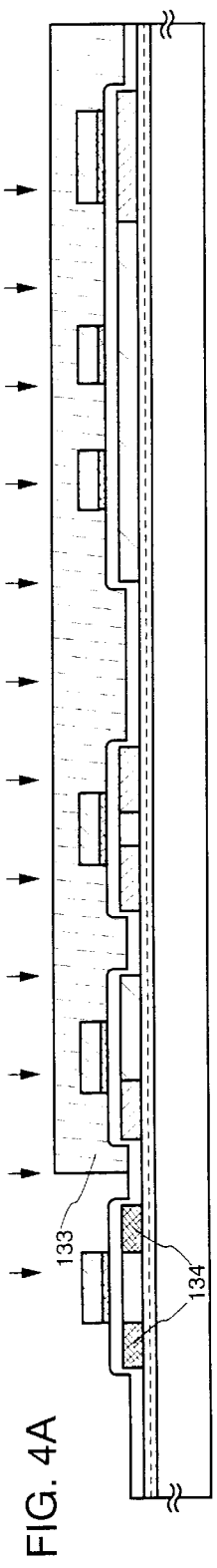
FIGS. 4A to 4D are diagrams showing a manufacturing process of an active matrix substrate.

Subsequently, a step of adding an impurity element for imparting a p-type conductivity is performed to form source and drain regions of a p-channel TFT in the driver circuit. In this step, impurity regions are formed in a self-alignment manner with the gate electrode 128 used as a mask. The regions where n-channel TFTs are to be formed are covered with a resist mask 133. Impurity regions 134 were formed by ion doping using diborane (B$_2$H$_6$). The concentration of boron (B) in these regions is set to $3\times10^{20}$ to $3\times10^{21}$ atoms/cm$^3$. In this specification, the concentration of the impurity element imparting p-type conductivity contained in the impurity region 134 formed in this step is represented as (p+) (FIG. 4A).

Next, regions used as gettering sites are formed. Resist masks 135, 136a, 136b, and 137 were formed and a rare gas element was added. That is, ion doping using argon gas was performed so that the argon concentrations in these regions were $1\times10^{20}$ to $5\times10^{21}$ atoms/cm$^3$.

Figure 4B:
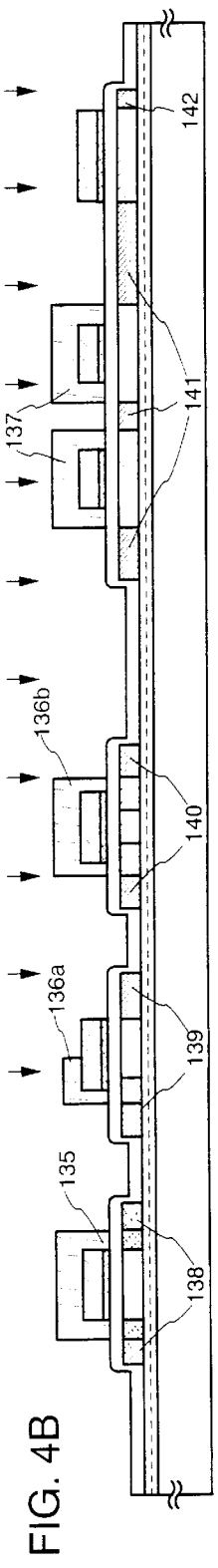

Subsequently, impurity regions each functioning as a source or drain region in each n-channel TFT are formed. The same resist masks 135, 136a, 136b, and 137 are used and an impurity element imparting an n-type conductivity is added to form impurity regions 138 to 142. That is, ion doping using phosphine (PH$_3$) was performed so that the phosphorus (P) concentrations in these regions were $1\times10^{20}$ to $1\times10^{21}$ atoms/cm$^3$. In this specification, the concentration of the impurity element contained in the impurity regions 138 to 142 formed in this step to form an n-type conductivity is represented as (n$^+$) (FIG. 4B).

The impurity regions 138 to 142 contain phosphorus (P) or boron (B) added in the preceding step. However, phosphorus (P) is added in this step at a concentration sufficiently higher than the concentration of phosphorus (P) or boron (B) added in the preceding step. Therefore the influence of phosphorus (P) or boron (B) added in the preceding step may be ignored. Also, the concentration of phosphorus (P) added to the impurity regions is ½ to ⅓ of the concentration of boron (B) added in the step shown in FIG. 4A, so that p-type conductivity can be ensured. This effect was confirmed and no influence on TFT characteristics was recognized.

Figure 4C:
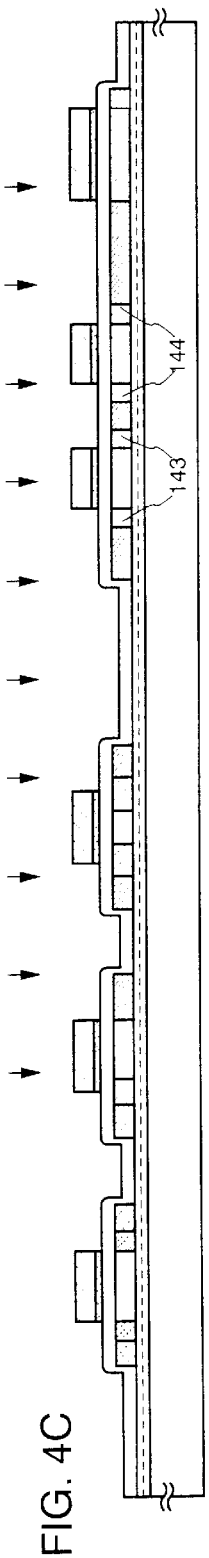
Figure 4D:
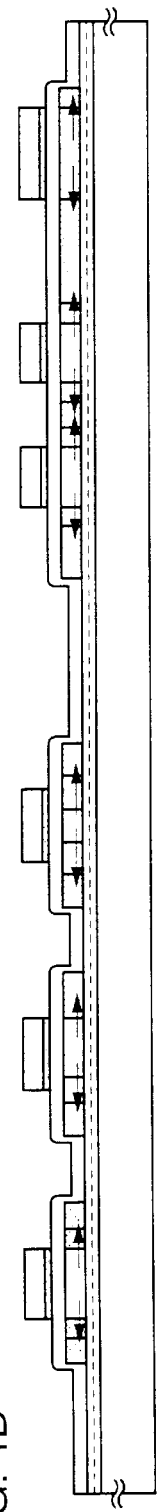

The mask is thereafter removed and a step of adding an impurity for imparting an n-type conductivity is performed to form LDD regions of an n-channel TFT in the pixel portion. An impurity element for imparting an n-type conductivity was added by ion doping in a self-alignment manner using the gate electrode 131 as a mask. The concentration of added phosphorus (P) is $1\times10^{16}$ to $5\times10^{18}$ atoms/cm$^3$. Thus, in this step, the impurity element is added to a concentration lower than those in the steps shown in FIG. 3A. FIG. 4A, and FIG. 4B to form impurity regions 143 and 144 substantially exclusively. In this specification, the concentration of the impurity element imparting an n-type conductivity contained in these impurity regions 143 and 144 is represented as (n$^-$) (FIG. 4C).

Gettering is then performed. In this embodiment, since the amorphous silicon film is crystallized by the method using a metallic element, a small amount of the metallic element remains in the semiconductor layer, and it is desirable to remove the metallic element at least from the channel region or reduce the amount of the metallic element at least in the channel region. As a means for removing the metallic element, the gettering effect based on addition of argon (Ar) is utilized. Heat treatment in a nitrogen atmosphere at 450 to 800° C. for 1 to 24 hours, more specifically at 550° C. for 14 hours may be performed for this gettering, for example, whereby the metallic element is caused to move in the directions of arrows indicated in FIG. 4D and to segregate in the impurity regions 138 to 142 provided as gettering sites. Irradiation with strong light may be performed instead of ordinary heat treatment. Also, irradiation with strong light may be performed in addition to ordinary heat treatment. However, in a case where the RTA method using light emitted from a halogen lamp, a metal halide lamp, a xenon arc lamp, a carbon arc lamp, a high-pressure sodium lamp, or a high-pressure mercury lamp is used as a gettering heating means, it is desirable that the semiconductor film be heated with strong light such that the temperature at which the semiconductor film is heated is 400 to 550° C. If the heating temperature is excessively high, strain in the semiconductor film is eliminated and the effect of causing nickel to spring out of the gettering site (nickel silicide) and the effect of capturing nickel are lost, so that the gettering efficiency is reduced.

Subsequently, a process step of activating the impurity elements imparting an n-type and p-type conductivity which are added at the respective concentrations is performed. In this step, furnace annealing, laser annealing, or rapid thermal annealing (RTA) may be performed. In this embodiment, the activation step was performed by irradiation with the second harmonic of a YAG laser through the back surface. By this activation, a good junction was formed between the channel region and the impurity regions to which the impurity element was added.

Next, a second conductive film to be used as a gate wiring is formed. The second conductive film may be formed of a conductive layer (D) formed from a low-resistance material, e.g., a material containing aluminum (Al) or copper (Cu) as a main constituent, and a conductive layer (E) formed from the group consisting of titanium (Ti), tantalum (Ta), tungsten (W) and molybdenum (Mo). In this embodiment, an aluminum (Al) film containing 0.1 to 2% by weight of titanium (Ti) was formed as a conductive layer (D) 145, and a titanium (Ti) film was formed as a conductive layer (E) 146. The conductive layer (D) 145 may be formed with a thickness of 200 to 400 nm (preferably 250 to 350 nm), and the conductive layer (E) 146 may be formed with a thickness of 50 to 200 nm (preferably 100 to 150 nm) (FIG. 5A).

To form gate wiring to be connected to the gate electrodes, the conductive layer (E) 146 and the conductive layer (D) 145 are etched to form gate wirings 147 (147a and 147b) and 148 (148a and 148b) and a capacitor wiring 149 (149a and 149b). This etching step was performed as described below. Portions of the layers from the surface of the conductive layer (E) to an intermediate point in the conductive layer (D) were removed by dry etching using a mixture gas of SiCl$_4$, Cl$_2$, and BCl$_3$. The conductive layer (D) was thereafter removed by wet etching using a phosphoric acid etching solution. In this manner, gate wirings were formed while maintaining selective workability in relation to the base layer.

Next, a first interlayer insulating film 150 is formed. A silicon oxide film or silicon oxynitride film having a thickness of 500 to 1500 nm is formed as the first interlayer insulating film 150. Contact holes are thereafter formed each reaching the source or drain region formed in each semiconductor layer, and source wirings 151 to 154 and drain wirings 155 to 158 are formed. In this embodiment, each of these electrodes was formed as a three-layer structure (not shown) by successively forming a 100 nm thick Ti film, a 300 nm thick aluminum film containing Ti, and a 150 nm thick Ti film.

Next, a silicon nitride film or silicon oxynitride film having a thickness of 50 to 500 nm (typically 100 to 300 nm) is formed as a passivation film 159. In this state, heat treatment (at 300 to 550° C. for 1 to 12 hours) may be performed to effect hydrogenation. This step is a step of terminating dangling bonds of the semiconductor layer by hydrogen contained in the passivation film 159. The semiconductor layer can be hydrogenated regardless of the existence of the first interlayer insulating film. As an alternative hydrogenation means, plasma hydrogenation (using hydrogen excited by plasma) may be performed. An opening portion may be formed in the passivation film 159 at a position where a contact hole for connection between a pixel electrode and a drain wiring is formed later (FIG. 5C).

Thereafter, a second interlayer insulating film 160 formed from an organic resin and having a thickness of 1.0 to 1.5 μm is formed. As this organic resin, polyimide, acrylic, polyamide, polyimide-amide, benzocyclobutene (BCB) or the like may be used. In this embodiment, polyimide to be thermally polymerized after being applied to a substrate was used. It was formed by being baked at 300° C. A contact hole is formed in the second interlayer insulating film 160 so as to reach the drain wiring 158, and a pixel electrode 161 is formed. To form the pixel electrode, a transparent conductive film may be used if a transmission-type liquid crystal display device is manufactured. A metallic film having a high reflectivity may be used if a reflection-type liquid crystal display device is manufactured. In this embodiment, an indium-tin oxide (ITO) film was formed to a thickness of 100 nm by sputtering to constitute a transmission-type liquid crystal display (FIG. 6).

The above-described process was performed to complete circuit components on one substrate including TFTs in one driver circuit and a pixel TFT in one pixel portion. In the driver circuit, a p-channel TFT 201 and a first n-channel TFT 202 constituting a CMOS circuit, and a second n-channel TFT 203 constituting a sampling circuit were formed. In the pixel portion, a pixel TFT 204 and a storage capacitor 205 were formed. In this specification, a substrate with such circuit components will be referred to as active matrix substrate for convenience sake.

The p-channel TFT 201 in the driver circuit has a channel region 206, source regions 207a and 207b and drain regions 208a and 208b in the semiconductor layer 104. The first n-channel TFT 202 has a channel region 209, an LDD region 210, a source region 211, and a drain region 212 in the semiconductor layer 105. The LDD region 210 is formed only on the drain region side and includes both a region overlapping the gate electrode 129 (such a LDD region hereinafter referred to as Lov region) and a region not overlapping the gate electrode 129 (such an LDD region hereinafter referred to as Loff region). The second n-channel TFT 203 has a channel region 213, LDD regions 214 and 215, a source region 216, and a drain region 217 in the semiconductor layer 106. Each of these LDD regions 214 and 215 includes a Lov region and a Loff region.

The pixel TFT 204 has channel regions 218 and 219, Loff regions 220 to 223, a source or drain regions 224 to 226 formed in the semiconductor layer 107. The storage capacitor 205 is formed by the capacitor wirings 132 and 149, an insulating film formed from the same material as the gate insulating film, and a semiconductor layer 227 which is connected to the drain region 226 of the pixel TFT 204 and which is added with an impurity element imparting an n-type conductivity. In FIG. 6, the pixel TFT 204 is formed in a double-gate structure. However, the pixel TFT 204 may alternatively be formed in a single-gate structure or a multigate structure having a plurality of gate electrodes.

According to the present invention, as described above, the TFT structure constituting the circuits can be optimized according to the desired specifications for the pixel TFT and the driver circuit to improve the operating performance and reliability of the semiconductor device. Further, the gate electrode is formed from a heat-resistant conductive material to facilitate activation of the LDD region, the source region and the drain region, and the gate wiring is formed from a low-resistance material to effectively reduce the wiring resistance. Therefore the present invention can be applied to a display device having a pixel portion (screen size) of four inches or larger.

[Embodiment 2]

In this embodiment, a process in which an active matrix liquid crystal display device is manufactured on the basis of an active matrix substrate manufactured in accordance with Embodiment 1 will be described below. FIG. 6 is referred to for the description.

An active matrix substrate such as shown in FIG. 6 is first obtained by the process of Embodiment 1. An alignment film is formed on the active matrix substrate in FIG. 6 and rubbing is performed on the alignment film. In this embodiment, columnar spacers for maintaining a substrate spacing were formed at desired positions by patterning an organic resin film such as an acrylic resin film before the formation of the alignment film. Spherical spacers may be spread over the entire substrate surface instead of the columnar spacers.

Next, an opposing substrate is prepared. A color filter having coloring layers and a light shielding layer placed in correspondence with respective pixels is provided on this opposing substrate. A light shielding layer is also provided to the portion of driver circuits. A leveling film covering the color filter and the light shielding layer is provided. Opposing electrodes formed from a transparent conductive film are then formed on the pixel portion, and the alignment film is formed on the entire surface of the opposing substrate and rubbed.

The active matrix substrate having the pixel portion and driver circuits formed thereon and the opposing substrate are bonded together by using a sealing material. The sealing material has a filler mixed therein. The two substrates are bonded together while being uniformly spaced apart from each other by the filler and the columnar spacers. Thereafter, a liquid crystal material is injected into the space between the two substrates and is completely enclosed therein by a sealant (not shown). As this liquid crystal material, a well-known liquid crystal material may be used. Thus, an active matrix liquid crystal display device is completed. If necessary, the active matrix substrate or the opposing substrate is cut so as to have a desired shape. Further, a polarizing plate, etc., are provided as desired by using well-known techniques. A flexible printed circuit (FPC) is attached to the display device by using a well-known technique.

A liquid crystal module obtained in the above-described manner will be described with reference to the top view of FIG. 7.

Figure 7:
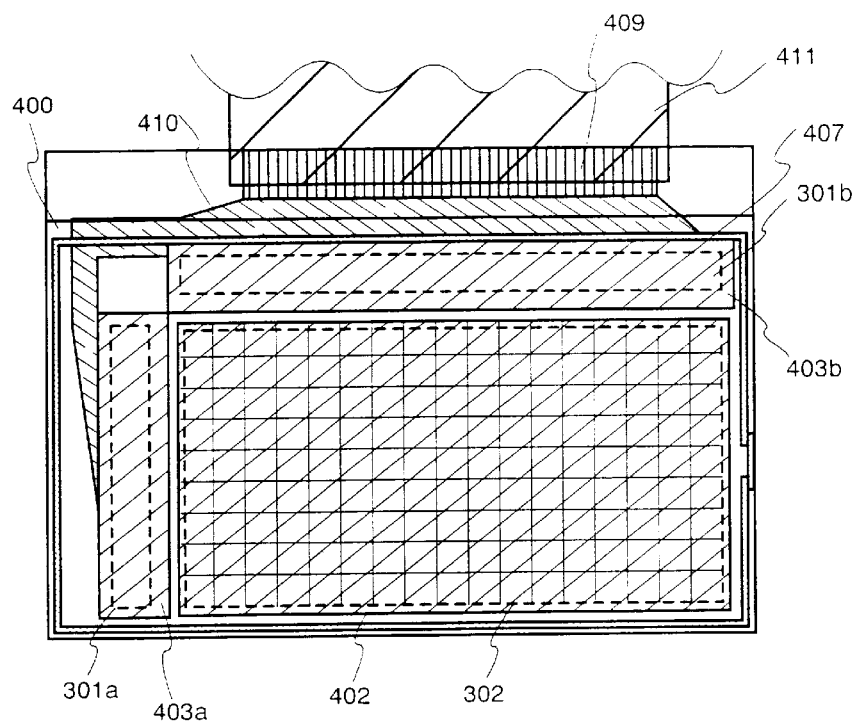
FIG. 7 is a top view showing an external appearance of a liquid crystal module.

Referring to FIG. 7 showing the top view of the liquid crystal module, an active matrix substrate on which a pixel portion, driver circuits, an external input terminal 409 to which a flexible printed circuit (FPC) 411 is attached, wiring 410 for connection between the external input terminal and input portions of the circuits, etc., are formed and an opposing substrate 400 on which a color filter, etc., are provided are bonded together by a sealing material 407.

A light shielding layer 403a is formed on the opposing substrate side so as to be overlapped with a gate wiring side driver circuit 301a, while a light shielding layer 403b is formed on the opposing substrate side so as to be overlapped with a source wiring side driver circuit 301b. A color filter 402 provided on the opposing substrate side to be superposed on a pixel portion 302 has a light shielding layer, coloring layers for respective colors: red (R), green (G) and blue (B) provided in correspondence with pixel-forming segments. When an on-screen display is actually produced, a color display in the three colors: red (R), green (G) and blue (B) of the coloring layers is formed. However, any type of coloring layer array may be selected as desired.

The above-described color filter 402 provided on the opposing substrate for attaining a color display is not exclusively used. A color filter may be formed on the active matrix substrate in the process of manufacturing the active matrix substrate.

The light shielding layer is provided between each adjacent pair of pixel-forming segments of the color filter to block light passing through places other than the display area. While the light shielding layers 403a and 403b are provided on the regions extending over the driver circuits, it is not always necessary to provide the light shielding layers 403a and 403b because the regions extending over the driver circuits are covered with a cover member when the liquid crystal display device is incorporated as a display portion in an electronic device. Also, a light shielding layer may be formed on the active matrix substrate when the active matrix substrate is manufactured.

Further, the arrangement may alternatively be such that the light shielding layers are not provided and the lamination layer of a plurality of coloring layers forming the color filter is suitably placed between the opposing substrate and the counter electrodes to effect light shielding so that their portions are laid one on another, thereby blocking light passing through certain places (gaps between the pixel electrodes) other than the display region and light passing through the driver circuit.

The FPC 411 composed of a base film and wirings is attached to the external input terminal by an anisotropic conductive resin. A reinforcing plate is also provided to improve the mechanical strength of the connection therebetween.

The liquid crystal module manufactured as described above can be used as a display portion in various electronic appliances.

[Embodiment 3]

Herein, an example of a method of manufacturing an active matrix substrate which has a different TFT structure from that of Embodiment 1 will be described with reference to FIGS. 9A to 11. Further, this embodiment is according to manufacturing method of Embodiment Mode 2.

First, in the present example, a substrate 500 made of barium borosilicate glass such as #7059 and #1737 produced by Coming Co. or aluminoborosilicate glass is used. There is no particular limit to the substrate 500 as long as it has light transparency, and a quartz substrate may be used. Furthermore, a plastic substrate having heat resistance enduring a treatment temperature in this embodiment may be used.

Then, a base film 501 composed of an insulating film such as a silicon oxide film, a silicon nitride film, or a silicon oxynitride film is formed on the substrate 500. In this embodiment, the base film 501 has a two-layered structure: however, the base film 501 may be composed of a single-layer film of the insulating film or a multi-layered structure of two or more insulating films. In this embodiment, the silicon oxynitride film 501*a* is formed to a thickness of 50 nm and the silicon oxynitride film 501*b* is formed to a thickness of 100 nm. Next, the semiconductor layers 502 to 506 are formed on the base film. The semiconductor layers 502 to 506 are formed to a thickness of 25 to 50 nm (preferably, 30 to 60 nm). There is no particular limit to a material for the crystalline semiconductor film. Preferably, the crystalline semiconductor film may be formed of silicon or silicon germanium ($Si_XGe_{1-X}$ (X=0.0001 to 0.02)) alloy. In the present example, an amorphous silicon film with a thickness of 55 nm was formed by plasma CVD, and a solution containing nickel was held on the amorphous silicon film. The amorphous silicon film was dehydrogenated (500° C., 1 hour) and crystallized (550° C., 4 hours) by heat treatment, and subjected to laser annealing for the purpose of enhancing crystallization, whereby a crystalline silicon film was formed in desired shape.

Then, the surfaces of the semiconductor layers 502 to 506 were washed with a fluoric acid type etchant such as a buffer fluoric acid, and thereafter, an insulating film 507 containing silicon as its main component was formed to a thickness of 40 to 150 nm by plasma CVD or sputtering.

Then, as shown in FIG. 9A, a first conductive film 508 with a thickness of 20 to 100 nm and a second conductive film 509 with a thickness of 100 to 400 nm were stacked on the gate insulating film 507. In this embodiment, the first conductive film 508 made of a TaN film (thickness: 30 nm) and a second conductive film 509 made of a W film (thickness: 370 nm) were stacked.

In the present example, the first conductive film 508 was made of TaN, and the second conductive film 509 was made of W. However, the present invention is not particularly limited thereto. Any of the first conductive film 508 and the second conductive film 509 may be composed of a single layer or a multi-layer made of an element selected from the group consisting of Ta, W, Ti, Mo, Al, Cu, Cr, and Nd, or an alloy material or a compound material containing the element as a main component. A semiconductor film such as a polycrystalline silicon film doped with an impurity element such as phosphorus may be used. Furthermore, an AgPdCu alloy may be used. Furthermore, the following combinations may be used: a first conductive film made of a tantalum (Ta) film and a second conductive film made of a tungsten (W) film; a combination of a first conductive film made of a titanium nitride (TiN) film and a second conductive film made of a W film; a combination of a first conductive film made of a tantalum nitride (TaN) film and a second conductive film made of an Al film; and a combination of a first conductive film made of a tantalum nitride (TaN) film and a second conductive film made of a Cu film may be used.

Next, resist masks 510 to 515 are formed by photolithography, and a first etching treatment for forming electrodes and wiring is conducted. The first etching treatment is conducted under first and second etching conditions. In this embodiment, under the first etching condition, etching was conducted by generating plasma by an inductively coupled plasma (ICP) etching method, using $CF_4$, $Cl_2$, and $O_2$ as an etching gas at a gas flow ratio of 25/25/10 (scm) respectively with an RF (13.56 MHz) power of 500 W supplied to a coil-type electrode under a pressure of 1 Pa. As the etching gas, a chlorine type gas such as $Cl_2$, $BCl_3$, $SiCl_4$, or $CCl_4$, or a fluorine type gas such as $CF_4$, $SF_6$, and $NF_3$, or $O_2$ can be appropriately used. Herein, a dry etching apparatus (Model E645 ((ICP) using ICP produced by Matsushita Electric Industrial Co., Ltd. was used. An RF (13.56 MHz) power of 150 W was also supplied to the substrate side (sample stage), whereby a substantially negative self-bias voltage was applied. Under the first etching condition, the W film is etched, and the ends of the first conductive layer are tapered. The etching speed with respect to W under the first etching condition was 200.39 nm/min, the etching speed with respect to TaN under the first etching condition is 80.32 nm/min, and the selection ratio of W with respect to TaN is about 2.5. Furthermore, a taper angle of W becomes about 26° under the first etching condition.

Thereafter, the etching condition was changed to the second etching condition without removing the resist masks 510 to 515, and etching was conducted for about 30 seconds by generating plasma, using $CF_4$ and $Cl_2$ as an etching gas at a gas flow ratio of 30/30 (sccm) respectively with an RF (13.56 MHz) power of 500 W supplied to a coil-type electrode under a pressure of 1 Pa. An RF (13.56 MHz) power of 20 W is also supplied to the substrate side (sample stage), whereby a substantially negative self-bias voltage is applied. Under the second etching condition using a mixture of $CF_4$ and $Cl_2$, the W film and the TaN film are etched to the same degree. The etching speed with respect to W under the second etching condition is 58.97 nm/min, and the etching speed with respect to TaN under the second etching condition is 66.43 nm/min. In order to conduct etching without leaving a residue on the gate insulating film, an etching time may be increased at a rate of about 10 to 20%.

In the above-mentioned first etching treatment, by appropriately forming the shape of a resist mask, the ends of the first conductive layers and the second conductive layers are tapered due to the effect of a bias voltage applied to the substrate side. The angle of the taper portions may be set at 15° to 45°.

Thus, first-shape conductive layers 516 to 521 (composed of first conductive layers 516*a* to 521*a* and second conductive layers 516*b* to 521*b*) are made of the first conductive layer and the second conductive layer by the first etching treatment.

Then, a first doping treatment is conducted without removing the resist masks, and rare gas element and an n-type impurity element are added to the semiconductor layer (FIG. 9B). The doping treatment may be conducted by ion doping or ion implantation. Here, argon as a rare gas is added by an ion doping method with a 100% argon gas as a doping gas. After that, the phosphorus as an n-type impurity element is added without exposure to the atmosphere by an ion doping method with phosphine ($PH_3$) 5% dilute hydrogen.

In this case, the conductive layers 516 to 521 function as a mask with respect to the n-type impurity element, and high-concentration impurity regions 522 to 533 are formed in a self-alignment manner. Argon is added to the high-concentration impurity regions 522 to 533 in a concentration range of $1 \times 10^{20}$ to $5 \times 10^{21}/cm^3$. An n-type impurity element is added to the high-concentration impurity regions 522 to 533 in a concentration range of $3 \times 10^{19}$ to $3 \times 10^{20}/cm^3$.

Further, in the first doping process, argon can be added after phosphorus is added. By using rare gas including phosphine as a raw material gas as a first doping process, phosphorus element and rare gas element can be added to the semiconductor film in the same step by the first doping process.

Then, a second etching treatment is conducted without removing the resist masks. Herein, etching was conducted for 25 seconds by generating plasma, using $SF_6$, $Cl_2$, and $O_2$ as an etching gas at a gas flow ratio of 24/12/24 (sccm) respectively with an RF (13.56 MHz) power of 700 W supplied to a coil-type electrode under a pressure of 1.3 Pa. An RF (13.56 MHz) power of 10 W is also supplied to the substrate side (sample stage), whereby a substantially negative self-bias voltage is applied. The etching speed with respect to W in the second etching treatment is 227.3 nm/min, the etching speed with respect to TaN in the second etching treatment is 32.1 nm/min, the selection ratio of W with respect to TaN is 7.1, the etching speed with respect to SiON that is the insulating film 507 is 33.7 nm/min, and the selection ratio of W with respect to SiON is 6.83. Thus, in the case of using $SF_6$ as an etching gas, the selection ratio with respect to the insulating film 507 is high, so that a decrease in a film can be suppressed. Furthermore, in a TFT of a driver circuit, reliability is higher as the width of taper portions in a channel length direction is longer. Therefore, when taper portions are formed, it is effective to conduct dry etching with an etching gas containing $SF_6$.

The taper angle of W became 70° in the second etching treatment. Second conductive layers 534b to 539b are formed by the second etching treatment. On the other hand, the first conductive layers are hardly etched, and first conductive layers 534a to 539a are formed. Thus, second shape of electrodes 534 to 539 are formed. In the second etching treatment, $CF_4$, $Cl_2$, and $O_2$ can be used as an etching gas.

Then, after the resist masks are removed, a second doping treatment is conducted to obtain a state shown in FIG. 9C. Doping is conducted using the second conductive layers 534b to 539b as masks with respect to an impurity element so that the impurity element is added to the semiconductor layer under the taper portions of the first conductive layers. In this embodiment, plasma doping was conducted using phosphorus (P) as the impurity element under the condition of a dose amount of $1.5 \times 10^{14}/cm^2$, an acceleration voltage of 90 keV. an ion current density of 0.5 $\mu A/cm^2$, a phosphine ($PH_3$) 5% hydrogen diluted gas, and a gas flow ratio of 30 (sccm). Thus, low-concentration impurity regions 541 to 554 overlapping the first conductive layers are formed in a self-alignment manner. The concentration of phosphorus (P) added to the low-concentration impurity regions 541 to 554 is $1 \times 10^{17}$ to $1 \times 10^{19}/cm^3$, and has a concentration gradient depending upon the film thickness of the taper portions of the first conductive layers. In the semiconductor layers overlapping the taper portions of the first conductive layers, an impurity concentration (P concentration) is gradually decreased toward the inside from the ends of the taper portions of the first conductive layers. Furthermore, the impurity element is also added to the high-concentration impurity regions 522 to 533, whereby high-concentration impurity regions 555 to 566 are formed.

Then, semiconductor layers to be active layers of n-channel TFTs are covered with resist masks 567 to 569, and a third doping treatment is conducted. Because of the third doping treatment, p-type impurity regions 570 to 573 (high-concentration impurity regions 570a to 573a and low-concentration impurity regions 570b to 573b) are formed in semiconductor layers to be active layers of p-channel TFTs, in which an impurity element providing a conductivity (p-type) opposite to the above-mentioned n-type is added (FIG. 10A). Phosphorus is added to the impurity regions 570a to 573a in different concentrations, respectively. However, by conducting a doping treatment so that the concentration of boron becomes $6 \times 10^{19}$ to $6 \times 10^{20}/cm^3$ in any of these regions, these regions function as source regions and drain regions of p-channel TFTs. Therefore, there is no problem.

Then, a resist mask 574 is formed, and a third etching treatment is conducted. In the third etching treatment, only taper portions of the first conductive layers are selectively etched. The third etching treatment is conducted in an ICP etching apparatus, using $Cl_3$ having a high selection ratio with respect to W as an etching gas. Because of the third etching, the first conductive layers 537c to 539c are formed (FIG. 10B).

Because of the third etching treatment, in a pixel portion low-concentration impurity regions (LDD regions) 547 to 554 having a concentration gradient are formed so as not to overlap the first conductive layers 537c to 539c. In a driver circuit, the low-concentration impurity regions 541 to 546 (GOLD region) remain overlapping the first conductive layers 534a to 536a. Thus, the configuration of a TFT is varied depending upon each circuit.

Further, though an example of conducting a third etching process after the third doping process is described in this embodiment, the third doping process can also be conducted after the third etching process.

Thereafter, the mask 574 formed from a resist is removed and gettering is performed. Heat treatment in a nitrogen atmosphere at 450 to 800° C. for 1 to 24 hours, more specifically at 550° C. for 4 hours may be performed for this gettering, whereby the metallic element is caused to move in the directions of arrows in FIG. 10C, i.e., from each channel region to the gettering sites. By this gettering, the metallic element contained in the semiconductor film overlapping the first conductive layer with the insulating film interposed therebetween, particularly in the channel region is removed or the concentration of the metallic element is reduced. In this gettering, a synergetic effect of gettering with the rare gas element and gettering with phosphorus can be obtained by selecting processing conditions. Irradiation with strong light may be performed instead of ordinary heat treatment. Also, irradiation with strong light may be performed in addition to ordinary heat treatment. However, in a case where the RTA method using light emitted from a halogen lamp, a metal halide lamp, a xenon arc lamp, a carbon arc lamp, a high-pressure sodium lamp, or a high-pressure mercury lamp is used as a gettering heating means, it is desirable that the semiconductor film be heated with strong light such that the temperature at which the semiconductor film is heated is 400 to 550° C. If the heating temperature is excessively high, strain in the semiconductor film is eliminated and the effect of causing nickel to spring out of the gettering site (nickel silicide) and the effect of capturing nickel are lost, so that the gettering efficiency is reduced.

It is also possible to activate the impurity elements (phosphorus, boron) simultaneously with gettering, depending upon gettering conditions.

Next, a first interlayer insulating film 575 is formed. An insulating film containing silicon and having a thickness of 10 to 200 nm is formed as the first interlayer insulating film 575 by plasma CVD or sputtering.

Subsequently, as shown in FIG. 10D, a step of activating the impurity element added to each semiconductor layer is performed. In this activation step, irradiation with YAG laser light or excimer laser light through the back surface is performed. By irradiation through the back surface, the impurity regions overlapping the gate electrode through the insulating film can be activated.

The example in which the first interlayer insulating film is formed before the activation is shown in this embodiment. However, the process steps may be changed such that the first interlayer insulating film is formed after the activation.

Thereafter, a step of forming a second interlayer insulating film 576 formed of a silicon nitride film, and heat-treating this film (at 300 to 550° C. for 1 to 12 hours) to hydrogenate the semiconductor layer is performed. In this embodiment, heat treatment was performed in a nitrogen atmosphere at 410° C. for 1 hour. This step is performed for the purpose of terminating dangling bonds of the semiconductor layer with hydrogen contained in the second interlayer insulating film 576. The semiconductor layer can be hydrogenated regardless of the existence of the first interlayer insulating film. As an alternative hydrogenation means, plasma hydrogenation (using hydrogen excited by plasma) may be performed.

A third interlayer insulating film 577 formed from an organic insulating material is formed on the second interlayer insulating film 576. In this embodiment, an acrylic resin film having a thickness of 1.6 μm was formed. Subsequently, patterning for forming contact holes reaching the impurity regions (577, 558, 561 to 563, 565, 570a, 571a, 572a, 573a) is performed. In this embodiment, a plurality of etching steps were performed. In this embodiment, the third interlayer insulating film was etched by using the second interlayer insulating film as an etching stopper, the second interlayer insulating film was then etched by using the first interlayer insulating film as an etching stopper, and the first interlayer insulating film was finally etched.

Subsequently, electrodes 578 to 586 respectively connected electrically to the impurity regions (577, 558, 561 to 563, 570a, 571a, 572a, 573a) and a pixel electrode 587 electrically connected to the impurity region 565 are formed. As the material of electrode and the pixel electrode, a material having a high reflectivity, e.g., a film containing Al or Ag as a main constituent or a lamination film formed of such a film is used.

The manufacturing process is thus performed to form, on one substrate, a driver circuit 601 having a logic circuit 603 constituted by an n-channel TFT 606 and a p-channel TFT 605, and a sampling circuit 604 constituted by an n-channel TFT 608 and a p-channel TFT 607, and a pixel portion 602 having an n-channel TFT 609 as a pixel TFT and a storage capacitor 610.

In this embodiment, the n-channel TFT 609 takes a structure (double-gate structure) having two channel regions between the source and drain regions. In this embodiment, however, the double-gate structure is not exclusively used, and a single-gate structure having one channel region or a triple-gate structure having three channel regions may be used.

In this embodiment, since a large amount of a rare gas element is added, the rare gas element is also added to the base film and to the substrate. The rare gas element is added to regions of the base film and the substrate other than those covered with the electrodes 516 to 521, i.e., base film regions or substrate regions other than those positioned below the channel regions 588 to 593 and the low-concentration impurity regions.

[Embodiment 4]

Figure 12:
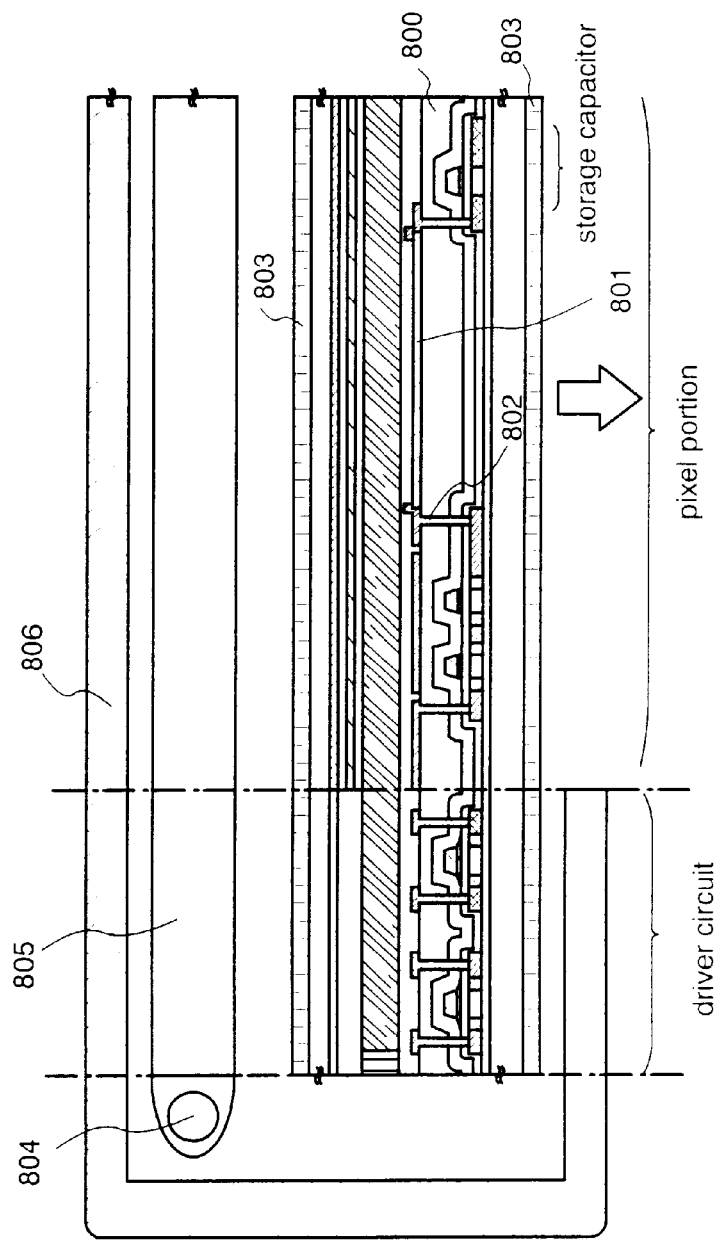
FIG. 12 is a diagram showing an example of a transmission type liquid crystal display device.

Embodiment 3 shows an exemplary reflection type display device in which a pixel electrode is made of a metal material with reflectivity. In this embodiment, an exemplary transmission type display device is shown in FIG. 12, in which a pixel electrode is made of a conductive film with light transparency.

The processes up to the process of forming an interlayer insulating film 800 are the same as those in Embodiment 3. Therefore, these processes will be omitted here. After the interlayer insulating film 577 is formed in accordance with Embodiment 1, a pixel electrode 801 made of a conductive film with light transparency is formed. As the conductive film having light transparency, ITO (indium tin oxide alloy), In$_2$O$_3$ (ZnO), zinc oxide (ZnO), or the like may be used.

Thereafter, contact holes are formed in the interlayer insulating film 800. Then, connection electrodes 802 overlapping the pixel electrodes 801 are formed. The connection electrode 802 are connected to drain regions through contact holes. Furthermore, a source region or a drain region of another TFT is also formed simultaneously with the connection electrodes 802.

Herein, an example in which all the driver circuits are formed on a substrate is shown. However, several ICs may be used in a part of a driver circuit.

Figure 14:
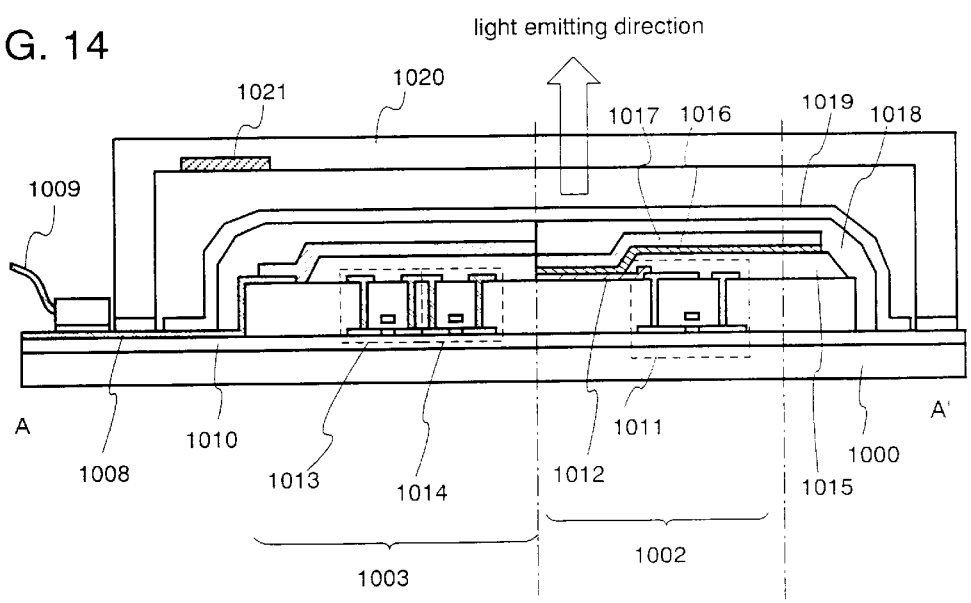
FIG. 14 is a cross-sectional view of an EL module.

An active matrix substrate is formed as described above. A liquid crystal module is manufactured in accordance with Embodiment 2, using the active matrix substrate, and a backlight 804 and a light-guiding plate 805 are provided, followed by disposing a cover 806, whereby an active matrix type liquid crystal display device as shown in FIG. 14 is completed. The cover 806 and the liquid crystal module are attached to each other with an adhesive or an organic resin. Furthermore, a substrate may be attached to a counter substrate by filling an organic resin between a frame and a substrate so as to surround the frame. Since the apparatus is of a transmission type, polarizing plates 803 are attached to both the active matrix substrate and the counter substrate.

This embodiment can be combined with Embodiment 3.

[Embodiment 5]

Figure 13A:
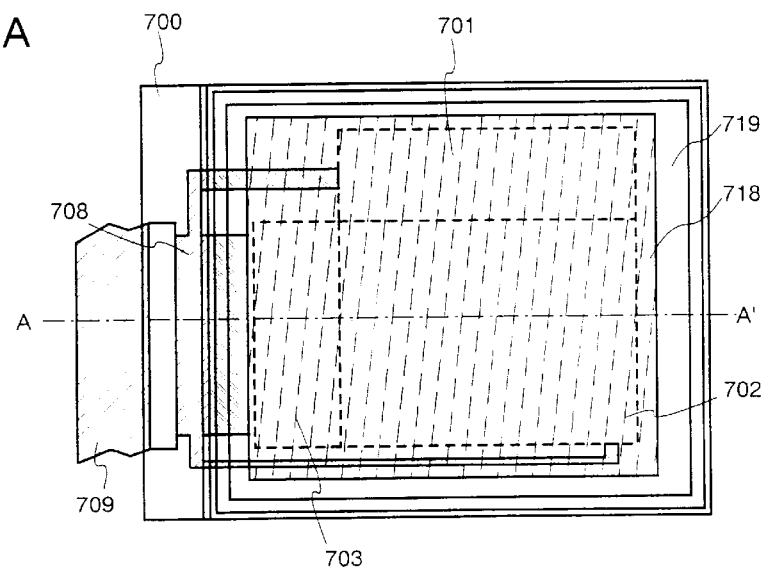
FIGS. 13A and 13B are a top view and a cross-sectional view, respectively, of an EL module.
Figure 13B:
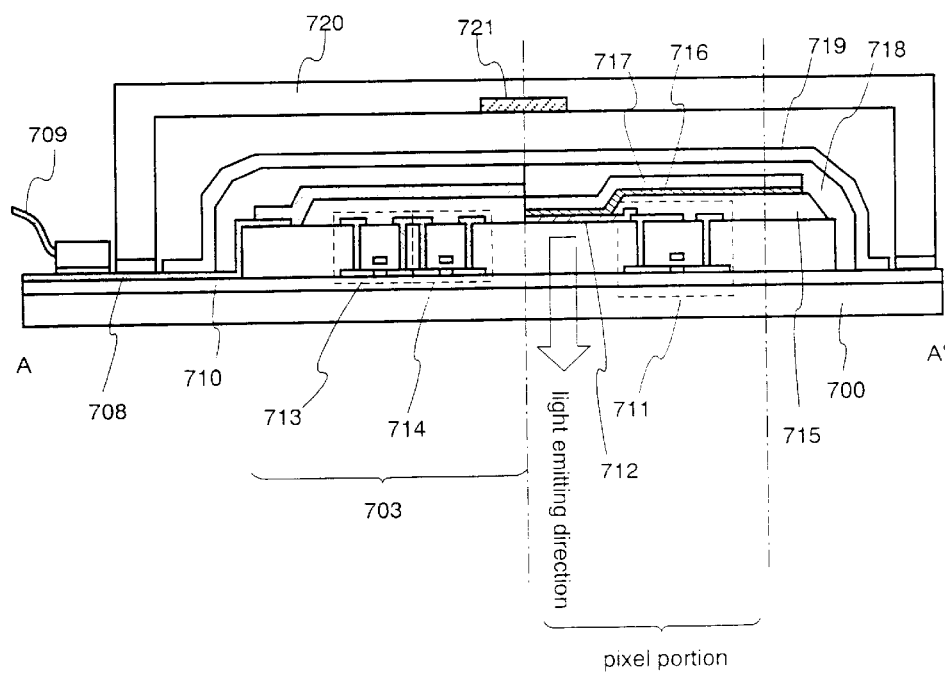

In this embodiment of the present invention, a light-emitting display device having an electroluminescence (EL) element shown in FIGS. 13A and 13B is manufactured.

FIG. 13A is a top view of an EL module, and FIG. 13B is a cross-sectional view taken along the line A–A' of FIG. 13A. A pixel portion 702, a source driver circuit 701, and a gate driver circuit 703 are formed on a substrate 700 (e.g., a glass substrate or a crystalline glass substrate) having an insulating surface. The pixel portion and the driver circuits can be obtained by a process in accordance with one of Embodiment Modes. A sealing material 718 and a diamond-like carbon (DLC) film 719 are used. The pixel portion and the driver circuit portions are covered with a layer of the sealing material 718 and the sealing material 718 is covered with the DLC film 719 for protection. Further, the pixel portion and the driver circuit portions are enclosed between a covering member 720 and the substrate by using an adhesive. It is desirable that the covering member 720 be formed from the same material as that of the substrate 700, for example, glass in order to resist deformation due to heat, external force, etc. The covering member 720 formed from such a material is worked into a recessed shape (having a depth of 3 to 10 μm) such as shown in FIG. 13B by sandblasting or the like. It is desirable to also form a recess (having a depth of 50 to 200 μm) capable of accommodating a desiccant 721. If a plurality of the EL modules are manufactured on one substrate, the substrate and the covering member, after being bonded to each other, are cut by a $CO_2$ laser or the like so as to have the same cut end surfaces.

Wiring 708 for transmitting signals to be input to the source driver circuit 701 and the gate driver circuit 703 is provided. A video signal, a clock signal, etc., are received through the wiring 708 from a flexible printed circuit (FPC) 709 used as an external input terminal. Although only the FPC is illustrated, a printed wiring board (PWB) may be attached to the FPC. The light-emitting device described in this specification also comprises a combination of the light-emitting device main unit and the FPC or a PWB attached to the main unit.

The structure of this embodiment as seen in the sectional view of FIG. 13B will next be described. An insulating film 710 is provided on the substrate 700, and the pixel portion 702 and the gate driver circuit 703 are formed on the insulating film 710. The pixel portion 702 is constituted by current control TFTs 711 and a plurality of pixels including pixel electrodes 712 electrically connected to the drains of the current control TFTs 711. The gate driver circuit 703 is formed by using a CMOS circuit including a combination of an n-channel TFT 713 and a p-channel TFT 714.

TFTs in these circuits (including TFTs 711, 713, and 714) may be manufactured in accordance with any of Embodiment Modes, Embodiment 1, and Embodiment 3. Each pixel electrode 712 functions as an anode of an EL element. Banks 715 are formed at the opposite ends of the pixel electrode 712. An EL layer 716 and a cathode 717 of the EL element are formed on the pixel electrode 712.

The EL layer 716 (layer for emitting light and for moving carriers to emit light) may be formed by freely combining a light-emitting layer, a charge transport layer or a charge injection layer, etc. For example, a low-molecular-weight organic EL material or a high-molecular-weight organic EL material may be used. As the EL layer, a thin film formed from a light-emitting material (singlet compound) capable of emitting light (fluorescence) by singlet excitation or a thin film formed from a light-emitting material (triplet compound) capable of emitting light (phosphorescence) by triplet excitation may be used. An organic material such as silicon carbide can be used as a charge transport layer or charge injection layer. The organic EL material and inorganic material for the above-described use may be selected from various well-known materials.

The cathode 717 also functions as a wiring connected in common to all the pixels. The cathode 717 is electrically connected to the FPC 709 via connection wiring 708. All the devices contained in the pixel portion 702 and the gate driver circuit 703 are covered with the cathode 717, the sealing material 718 and the protective film 719.

Preferably, a material having the highest possible transparency or translucence for visible light is used as the sealing material 718. Also, preferably, the sealing material 718 has the highest possible effect of limiting permeation of water and oxygen.

It is also preferable to provide the protective film 719 formed of a DLC film or the like at least on the surface of the sealing material 718 (exposed surface), as shown in FIGS. 13A and 13B, after the light-emitting device has been completely covered with the sealing material 718. The protective film may be provided on the entire surface including the back surface of the substrate. In such a case, care must be exercised to avoid forming the protective film on the region where external input terminal (FPC) is provided. To avoid film forming on the external input terminal region, a mask may be used or the terminal region may be covered with a tape such as a Teflon tape used as a masking tape in CVD apparatus.

The EL device is enclosed in the above-described structure with the sealing material 718 and the protective film 719 to completely isolate the EL device from the outside and to prevent substances which promote degradation of the EL layer by oxidation, e.g., water and oxygen from entering the EL device from the outside. Thus, the light-emitting device having improved reliability can be obtained.

Another type of EL module may be constructed in such a manner that the pixel electrode is used as a cathode and an anode is formed on the EL layer, light being emitted in a direction opposite to the emission direction indicated in FIGS. 13A and 13B. FIG. 14 illustrates an example of such a type of EL module. The construction of this module as seen in a top view is identical to that shown in FIG. 13A. Therefore it will be described with reference to a sectional view only.

The structure as seen in the sectional view of FIG. 14 will be described below. A substrate 1000 is, for example, a glass substrate or a quartz substrate. Also, a semiconductor substrate or a metallic substrate may be used for the substrate 1000. An insulating film 1010 is provided on the substrate 1000, and a pixel portion 1002 and a gate driver circuit 1003 are formed on the insulating film 1010. The pixel portion 1002 is constituted by current control TFTs 1011 and a plurality of pixels including pixel electrodes 1012 electrically connected to the drains of the current control TFTs 1011. The gate driver circuit 1003 is formed by using a CMOS circuit including a combination of an n-channel TFT 1013 and a p-channel TFT 1014.

Each pixel electrode 1012 functions as a cathode of an EL element. Banks 1015 are formed at the opposite ends of the pixel electrode 1012. An EL layer 1016 and an anode 1017 of the EL element are formed on the pixel electrode 1012.

The anode 1017 also functions as a wiring connected in common to all the pixels. The anode 1017 is electrically connected to FPC 1009 via connection wiring 1008. All the device contained in the pixel portion 1002 and the gate driver circuit 1003 are covered with the anode 1017, a sealing material 1018 and a protective film 1019 formed from DLC or the like. A covering member 1020 and the substrate 1000 are bonded together by an adhesive. A recess is formed in the covering member 1021 to accommodate a desiccant 1020.

Preferably, a material having the highest possible transparency or translucence for visible light is used as the sealing material 1018. Also, preferably, the sealing material 1018 has the highest possible effect of limiting permeation of water and oxygen.

In the arrangement shown in FIG. 14, the pixel electrode is used as the cathode while the anode is formed on the EL layer, so that the direction in which light is emitted is the direction of the arrow indicated in FIG. 14.

This embodiment can be combined with one of Embodiments 1 to 4.

[Embodiment 6]

In Embodiment 1, a top gate type TFT has been exemplified. The present invention is also applicable to a bottom gate type TFT shown in FIGS. 15A and 15B.

Figure 15A:
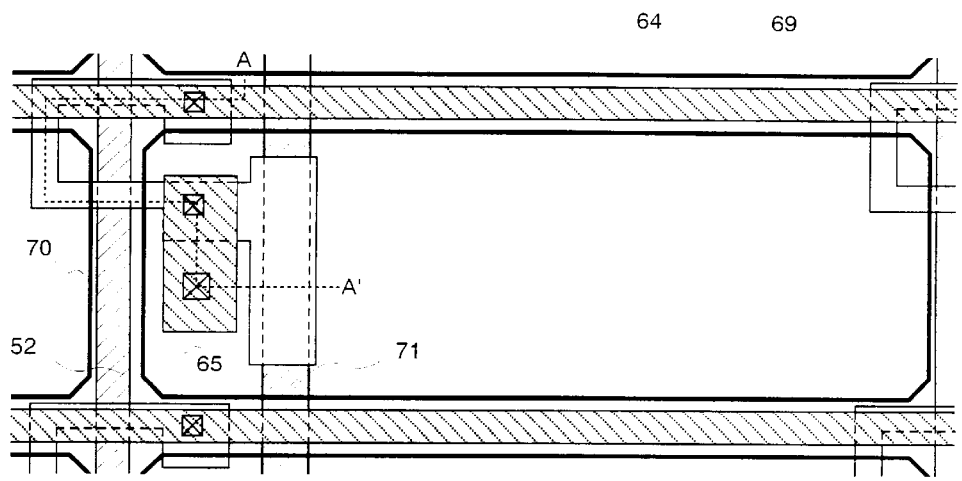
FIGS. 15A and 15B are cross-sectional views of an active matrix liquid crystal display device.

FIG. 15A is a top view showing an enlarged pixel in a pixel portion. In FIG. 15A, a portion taken along a dotted line A–A' corresponds to a cross-sectional structure of the pixel portion in FIG. 15B.

Figure 15B:
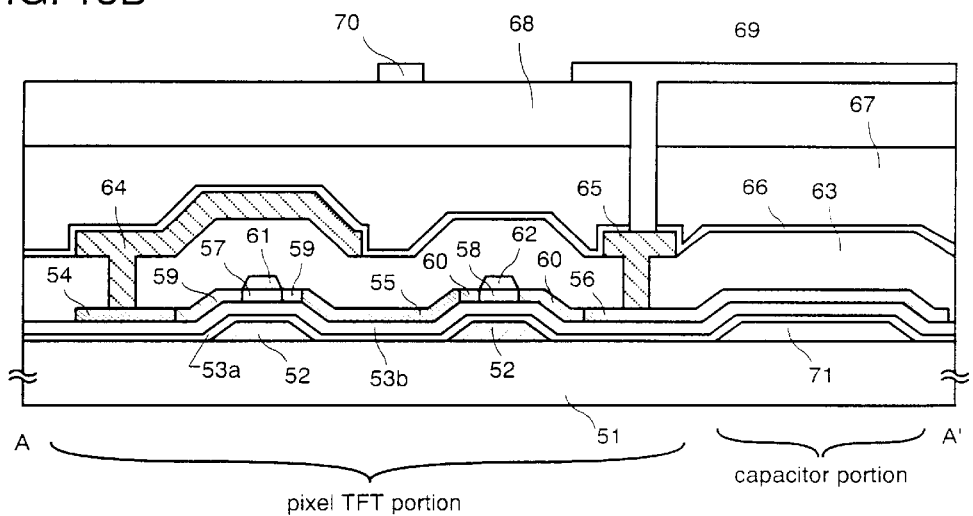

In the pixel portion shown in FIGS. 15A and 15B, a pixel TFT portion is composed of an n-channel TFT. Gate electrodes 52 are formed on a substrate 51, and a first insulating film 53a made of silicon nitride and a second insulating film 53b made of silicon oxide are provided. On the second insulating film 53b, source regions or drain regions 54 to 56 as an active layer, channel formation regions 57 and 58, and LDD regions 59 and 60 between the source region or drain region and the channel formation region are formed. The channel formation regions 57 and 58 are protected by insulating layers 61 and 62. After contact holes are formed in the first interlayer insulating film 63 covering the insulating layers 61, 62, and the active layer, a wiring 64 is connected to the source region 54 and a wiring 65 is connected to the drain region 56. A passivation film 66 is formed on the first interlayer insulating film 63. A second interlayer insulating film 67 is further formed on the passivation film 66. Furthermore, a third interlayer insulating film 68 is formed on the second interlayer insulating film 67. A pixel electrode 69 made of a transparent conductive film made of ITO, SnO, or the like is connected to the wiring 65. Reference numeral 70 denotes a pixel electrode adjacent to the pixel electrode 69.

In this embodiment, the channel formation regions 57 and 58 are provided according to Embodiment Mode 1 in which gettering is performed adding rare element to the source region or the drain regions 54 to 56.

In this embodiment, a channel stop type bottom gate type TFT has been described as an example. However, the present invention is not particularly limited thereto.

In this embodiment, a gate line of a pixel TFT in the pixel portion has a double-gate structure. However, in order to reduce variation in an OFF current, a multi-gate structure such as a triple gate structure may be used. Furthermore, in order to enhance an opening ratio, a single gate structure may be used.

Furthermore, a capacitor part of the pixel portion is composed of the first and second insulating films as a dielectric, capacitive wiring 71, and the drain region 56.

The pixel portion shown in FIGS. 15A and 15B is an example, and the pixel portion is not particularly limited to the above-mentioned configuration.

This embodiment can be combined with either one of Embodiments 1 to 5.

[Embodiment 7]

This embodiment of the present invention will be described in which after a metallic element has been added, gettering is performed by forming a mask and adding a rare gas element, patterning of a semiconductor film is performed, and the same gettering as that in Embodiment Mode 1 is again performed by adding a rare gas element.

Crystallization is performed by adding a metallic element in accordance with Embodiment Mode 1. In this embodiment, a first mask is formed from a silicon oxide film and a rare gas element is added to form gettering sites. The first mask is intended for gettering and may be a mask having slit-like openings, or a mask having a surface area larger than a mask used for semiconductor layer patterning performed afterward. Gettering is then performed by heat treatment or irradiation with strong light. Heat treatment in a nitrogen atmosphere at 450 to 800° C. for 1 to 24 hours, more specifically at 550° C. for 14 hours may be performed for this gettering, whereby the metallic element is caused to segregate at the gettering sites. Subsequently, patterning of the semiconductor layer is performed. The second mask used for this patterning is intended for patterning the semiconductor film, is smaller than the first mask and is formed inside the area covered by the first mask. By this patterning, the gettering sites are removed and semiconductor layer portions in the vicinity of the boundaries on the gettering sites are also removed. When gettering is performed, the metallic element is liable to segregate at the boundaries on the regions where the rare gas element has been added. Therefore, semiconductor film portions in the vicinity on the regions where the rare gas element has been added are also removed. Thus, the semiconductor layer is formed in a crystalline structure. Subsequent steps may be performed in accordance with Embodiment Mode 1.

In this embodiment, although the number of process steps and the number of masks are increased, the metallic element contained in the channel region can be further reduced because two gettering steps are performed. While this embodiment has been described with respect to the example in which two gettering steps are performed, the number of gettering steps is not particularly limited. Two or more gettering steps may be performed. Needless to say, this process may be performed in combination with another well-known method.

This embodiment can be combined with one of Embodiments 1 to 6.

[Embodiment 8]

This embodiment of the present invention will be described with reference to FIGS. 16A to 18, in which an active matrix substrate was manufactured by a process different from that in Embodiment 3.

This embodiment includes the same process steps as those in Embodiment 3, i.e., the step of forming a base film 1601 (a multilayer film formed of a silicon oxynitride film 1601a and a silicon oxynitride film 1601b), the step of forming semiconductor layers 1602 to 1606 on the base film 1601, the step of forming an insulating film 1607, and the step of successively forming a first conductive film 1608 and a second conductive film 1609 on the insulating film. The description for the same steps will not be repeated. FIG. 16A shows the same state as that shown in FIG. 9A.

After the conductive film forming step, first etching is performed by the same method as that in Embodiment 3 to form conductive layers 1616 to 1621 (first conductive layers 1616a to 1621a and second conductive layers 1616b to 1621b) in a first configuration from the first and second conductive layers with resist masks 1610 to 1615. This step and the other preceding steps are same as those in Embodiment 3.

In this embodiment, subsequently to the first etching, second etching is performed without removing the resist mask. In this embodiment, etching was performed for 25 seconds by using $SF_6$, $Cl_2$ and $O_2$ as etching gas, by setting the respective gas flow rates in proportions of 24/12/24 (sccm), and by producing plasma at a pressure of 1.3 Pa. To produce plasma, RF (13.56 MHz) power of 700 W was supplied to a coil-type electrode. RF (13.56 MHz) power of 10 W was also supplied to the substrate side (sample stage) to apply a substantially negative self-bias voltage. In the second etching; the rate of etching on W is 227.3 nm/min: the rate of etching on TaN is 32.1 nm/min; the selectivity ratio of W to TaN is 7.1. and the rate of etching on SiON forming the insulating film 1607 is 33.7 nm/min: and the selectivity ratio of W to TaN is 6.83. Thus, if $SF_6$ is used in etching gas, the selectivity ratio to the insulating film 1607 is high, so that film reduction can be suppressed. In the case of TFTs in the driver circuit, if the width of the tapered portion in the channel length direction is larger, the reliability is higher. Therefore it is effective to perform dry etching with an etching gas containing $SF_6$ in forming the tapered portion.

The W taper angle after this second etching was 70°. Second conductive layers 1622b to 1627b are formed by this second etching. On the other hand, the first conductive layer is etched only to a small extent and first conductive layers 1622a to 1627a are formed. The above-described second etching can be performed by using $CF_4$, $Cl_2$ and $O_2$ as etching gas.

The resist mask is thereafter removed, first doping is then performed, and the state shown in FIG. 16C results. This doping is performed by using the first conductive layers 1622a to 1627a as a mask against an impurity element so that the impurity element is not added to the semiconductor layer below each tapered portion of the first conductive layers. In this embodiment, plasma doping was performed by using phosphorus (P) as an impurity element and a phosphine ($PH_3$) 5% hydrogen diluted gas and by setting a gas flow rate of 30 sccm. Thus, a low-concentration impurity region ($n^-$ regions) 1628 which overlaps the first conductive layer is formed in a self-aligning manner. The concentration of phosphorus (P) added to this low-concentration impurity region 1628 is $1\times10^{17}$ to $1\times10^{19}/cm^3$.

The first doping may be performed so that the impurity element is added to semiconductor layer portions below the tapered portions of the first conductive layer. In such case, a concentration gradient is produced according to the thickness of each tapered portion of the first conductive layer.

Subsequently, resist masks 1629 to 1632 are formed and second doping is performed to add a rare gas element and an impurity element for imparting an n-type conductivity to portions of the semiconductor layer (FIG. 17A). In this doping, ion doping or ion implantation may be performed. In this embodiment, argon is used as a rare gas element and is added by ion doping using an argon 100% gas as doping gas. Thereafter, phosphorus used as an impurity element for imparting an n-type conductivity is added by ion doping using a phosphine (PHI) 5% hydrogen diluted gas. In the second doping, argon may be added after addition of phosphorus. Also, the second doping may be performed in such a manner that a rare gas including phosphine is provided as a raw material gas to add the phosphorus element and the rare gas element to the semiconductor film in the same step.

By the second doping, high-concentration impurity regions ($n^+$ regions) 1649 and 1650 which also function as gettering sites are formed in a self-alignment manner on the semiconductor layer 1603 on which an n-channel TFT constituting a logic circuit is formed afterward. In doping on this semiconductor layer, the conductive layer 1623 serves as a mask against phosphorus and argon. Simultaneously, by addition to regions below the tapered portions, low-concentration impurity regions ($n^-$ regions) 1635 and 1636 are formed. Accordingly, the n-channel TFT in the logic circuit formed afterward has only regions (gate-drain overlapped LDD (GOLD) regions) overlapping the gate electrode. In each of the low-concentration impurity regions ($n^-$ regions) 1635 and 1636, i.e., in each of semiconductor layers overlapping the tapered portions of the first conductive layer, the impurity density (P density) decreases gradually along an inward direction from the position corresponding to the end of the tapered portion of the first conductor layer.

By the second doping, high-concentration impurity regions 1653 and 1654 are formed in the regions not covered with the mask 1631 of the semiconductor layer 1605 on which an n-channel TFT constituting a sampling circuit is formed afterward. Also, low-concentration impurity regions ($n^-$ regions) 1639 and 1640 are formed in the regions of the semiconductor layer 1605 covered with the mask 1631. Accordingly, the n-channel TFT in the sampling circuit formed afterward has only low-concentration impurity regions (LDD regions) not overlapping the gate electrode.

In the second doping, even in the semiconductor layers 1602 and 1604 on which p-channel TFTs are formed afterward, there is a need to form gettering sites by addition to some portions. High-concentration impurity regions 1647, 1648, 1651, and 1652 which also function as gettering sites are formed in the regions not covered with the masks 1629 and 1630, and low-concentration impurity regions ($n^-$ regions) 1633, 1634, 1637, and 1638 are formed in the portions covered with the masks 1629 and 1630.

By the second doping, high-concentration impurity regions 1655 to 1658 which also function as gettering sites are formed in the portions not covered with the mask 1632 of the semiconductor layer 1606 on which an n-channel TFT in a pixel portion is formed afterward. Also, low-concentration impurity regions ($n^-$ regions) 1641 to 1644 are formed in the portions covered with the mask 1632. Accordingly, the n-channel TFT in the pixel portion formed afterward has only low-concentration impurity regions (LDD regions) not overlapping the gate electrode. In the region on which a capacitor portion in the pixel portion is formed afterward, a high-concentration impurity region 1658 is formed in a self-alignment manner, and low-concentration impurity regions ($n^-$ regions) 1645 and 1646 are formed below the tapered portions.

By the second doping, argon is added to the high-concentration impurity regions 1647 to 1658 within a density range of $1\times10^{20}$ to $5\times10^{21}/cm^3$, and the impurity element imparting an n-type conductivity is also added thereto within a density range of $3\times10^{19}$ to $1\times10^{21}/cm^3$.

Thereafter, the masks 1629 to 1632 are removed, the semiconductor layers in which active layers of the n-channel TFTs are formed afterward are then covered with resist masks 1659 to 1661, and third doping is performed (FIG. 17B). By the third doping, regions 1662 to 1665 containing the n-type impurity element and p-type impurity elements at high concentrations and regions (regions (LDD regions) 1666a to 1669a not overlapping the gate electrode, and overlap regions (GOLD regions) 1666b to 1669b overlapping the gate electrode) containing the n-type impurity at a low concentration and the p-type impurity at a high concentration are formed. Doping is performed so that the boron density is $6\times10^{19}$ to $6\times10^{20}/cm^3$ in either type of region to ensure functioning of the p-channel TFT source and drain regions without any problem.

In this embodiment, the first doping, the second doping and the third doping are performed in this order. However, it is not necessary to fix this order. The step order may be freely changed.

Thereafter, the resist masks 1659 to 1661 are removed and gettering is performed. Heat treatment in a nitrogen atmosphere at 450 to 800° C. for 1 to 24 hours, for example, at 550° C. for 4 hours may be performed for this gettering, whereby the metallic element is caused to move in the directions of arrows in FIG. 17C, i.e., from each channel region to the gettering sites. By this gettering, the metallic element contained in the semiconductor film overlapping the first conductive layer through the insulating film, particularly in the channel region is removed or the concentration of the metallic element is reduced. In this gettering, a synergetic effect of gettering with the rare gas element and gettering with phosphorus can be obtained by selecting processing conditions. Irradiation with strong light may be performed instead of ordinary heat treatment. Also, irradiation with strong light may be performed in addition to ordinary heat treatment. However, in a case where the RTA method using light emitted from a halogen lamp, a metal halide lamp, a xenon arc lamp, a carbon arc lamp, a high-pressure sodium lamp, or a high-pressure mercury lamp is used as a gettering heating means, it is desirable that the semiconductor film be heated with strong light so that the temperature at which the semiconductor film is heated is 400 to 550° C. If the heating temperature is excessively high, strain in the semiconductor film is eliminated and the effect of causing nickel to spring out of the gettering site (nickel silicide) and the effect of capturing nickel are lost, so that the gettering efficiency is reduced.

It is also possible to activate the impurity elements (phosphorus, boron) simultaneously with gettering, depending upon gettering conditions.

Next, a first interlayer insulating film 1670 is formed. An insulating film containing silicon and having a thickness of 10 to 200 nm is formed as the first interlayer insulating film 1670 by plasma CVD or sputtering.

Subsequently, as shown in FIG. 17D, a step of activating the impurity element added to each semiconductor layer is performed. In this activation step, irradiation with YAG laser light or excimer laser light through the back surface is performed. By irradiation through the back surface, the impurity regions overlapping the gate electrode through the insulating film can be activated.

This embodiment has been described with respect to the case where the first interlayer insulating film is formed before the above-described activation. However, the process steps may be changed such that the first interlayer insulating film is formed after the above-described activation.

Thereafter, a step of forming a second interlayer insulating film 1671 formed of a silicon nitride film, and heat-treating this film (at 300 to 550° C. for 1 to 12 hours) to hydrogenate the semiconductor layer is performed. In this embodiment, heat treatment was performed in a nitrogen atmosphere at 410° C. for 1 hour. This step is performed for the purpose of terminating dangling bonds of the semiconductor layer with hydrogen contained in the second interlayer insulating film 1671. The semiconductor layer can be hydrogenated regardless of the existence of the first interlayer insulating film. As an alternative hydrogenation means, plasma hydrogenation (using hydrogen excited by plasma) may be performed.

A third interlayer insulating film 1672 formed from an organic insulating material is formed on the second interlayer insulating film 1671. A silicon nitride film or AlNO film may be further formed by sputtering. In this embodiment, an acrylic resin film having a thickness of 1.6 μm was formed. Subsequently, patterning for forming contact holes reaching the high concentration impurity regions is performed. In this embodiment, a plurality of etching steps were performed. In this embodiment, the third interlayer insulating film was etched by using the second interlayer insulating film as an etching stopper, the second interlayer insulating film was then etched by using the first interlayer insulating film as an etching stopper, and the first interlayer insulating film was finally etched.

Subsequently, electrodes 1673 to 1681 respectively connected electrically to the high-concentration impurity regions and a pixel electrode 1682 electrically connected to the high-concentration impurity region 1657 are formed. As the material of these electrode and the pixel electrode, a material having a high reflectivity, e.g., a film containing Al or Ag as a main constituent or a multilayer film formed of such a film is used.

Figure 18:
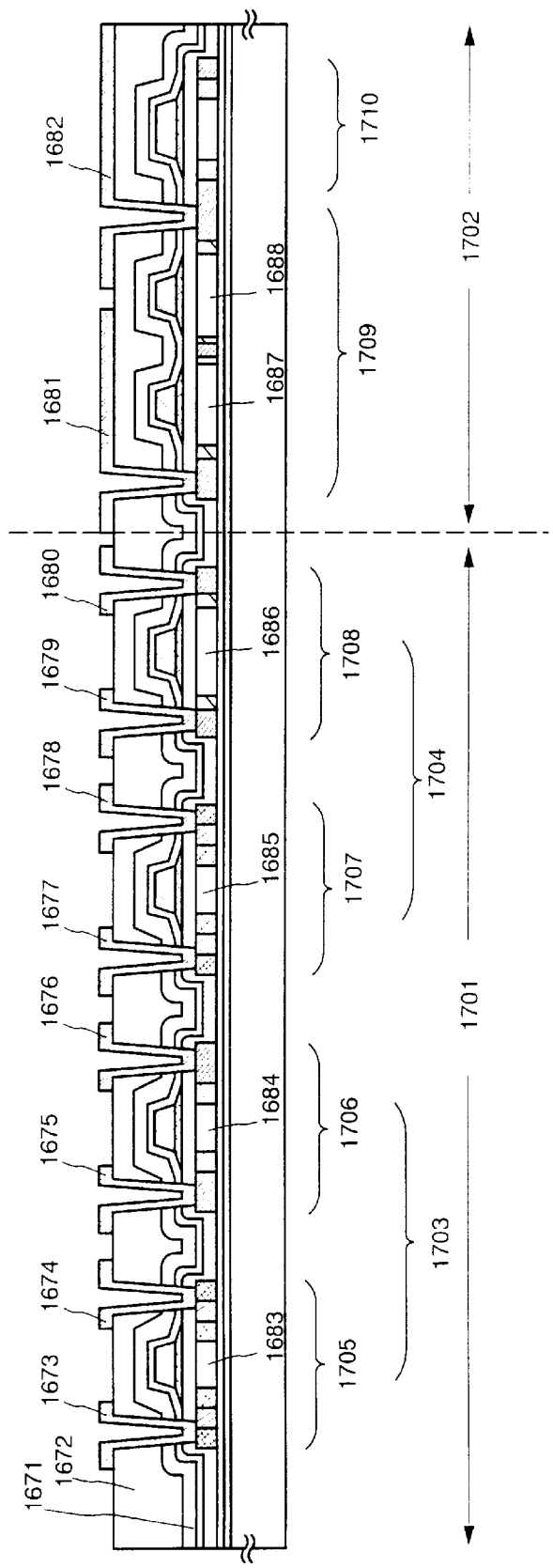
FIG. 18 is a diagram showing a manufacturing process of an active matrix substrate.

The manufacturing process is thus performed to form, on one substrate, a driver circuit 1701 having a logic circuit 1703 constituted by an n-channel TFT 1706 (channel region 1684) and a p-channel TFT 1705 (channel region 1683), and a sampling circuit 1704 constituted by an n-channel TFT 1708 (channel region 1686) and a p-channel TFT 1707 (channel region 1685), and a pixel portion 1702 having an n-channel TFT 1709 (channel regions 1687 and 1688) as a pixel TFT and a storage capacitor 1710 (FIG. 18).

In this embodiment, the n-channel TFT 1709 takes a structure (double-gate structure) having two channel regions between the source and drain regions. In this embodiment, however, the double-gate structure is not exclusively used, and a single-gate structure having one channel region or a triple-gate structure having three channel regions may be used.

This embodiment is characterized by the method in which high-concentration impurity regions are differently formed by the second doping in a self-alignment manner or by using masks to be adapted to different kinds of circuits. The structure of each of the n-channel TFTs 1706, 1708, and 1709 is a low-concentration drain (lightly doped drain (LDD)) structure. This structure is characterized by providing a region to which an impurity element is added at a low concentration between the channel region and the source or drain region formed by adding the impurity element at a high concentration. This region is called "LDD region". Further, the n-channel TFT 1706 takes a gate-drain overlapped LDD (GOLD) structure in which a LDD region is placed so as to overlap the gate electrode with gate insulating film interposed therebetween. The structure of the n-channel TFTs 1708 and 1709 is such that only a region (LDD region) not overlapping the gate electrode is provided. In this specification, the low-concentration impurity region (n⁻ region) overlapping the gate electrode through the insulating film is called GOLD region, while the low-concentration impurity region (n⁻ region) not overlapping the gate electrode is called "LDD region". The channel-direction width of the low-concentration impurity region not overlapping the gate electrode can be freely set by changing the mask at the time of second doping as desired. If the conditions for the first doping are changed such that the impurity element is added even at a position below the tapered portion, the n-channel TFT 1708 and 1709 can be constructed so as to have both an overlap region overlapping the gate electrode (GOLD region) and a region not overlapping the gate electrode (LDD region).

This embodiment can be combined with one of Embodiments 1 to 7.

[Embodiment 9]

The driver circuit and the pixel portion fabricated by implementing the present invention can be utilized for various modules (active matrix liquid crystal module, active matrix EL module and active matrix EC module). Namely, the present invention can be executed in all of the electronic apparatuses which is incorporated the various module to the display portion.

Following can be given as such electronic apparatuses: video cameras; digital cameras; head mounted displays (goggle type displays); car navigation systems; projectors; car stereo; personal computers; portable information terminals (mobile computers, mobile telephones or electronic books etc.) etc. Examples of these are shown in FIGS. 19A–19F, 20A–20D and 21A–21C.

FIG. 19A is a personal computer which comprises: a main body 2001; an image input portion 2002; a display portion 2003; and a keyboard 2004. The present invention can be applied to the display portion 2003.

FIG. 19B is a video camera which comprises: a main body 2101; a display portion 2102; a voice input portion 2103; operation switches 2104: a battery 2105 and an image receiving portion 2106. The present invention can be applied to the display portion 2102.

FIG. 19C is a mobile computer which comprises: a main body 2201; a camera portion 2202; an image receiving portion 2203; operation switches 2204 and a display portion 2205. The present invention can be applied to the display portion 2205.

FIG. 19D is a goggle type display which comprises: a main body 2301; a display portion 2302; and an arm portion 2303. The present invention can be applied to the display portion 2302.

FIG. 19E is a player using a recording medium which records a program (hereinafter referred to as a recording medium) which comprises: a main body 2401; a display portion 2402; a speaker portion 2403; a recording medium 2404; and operation switches 2405. This apparatus uses DVD (digital versatile disc), CD, etc. for the recording medium, and can perform music appreciation, film appreciation, games and use for Internet. The present invention can be applied to the display portion 2402.

FIG. 19F is a digital camera which comprises: a main body 2501; a display portion 2502; a view finder 2503; operation switches 2504; and an image receiving portion (not shown in the figure). The present invention can be applied to the display portion 2502.

Figure 20A:
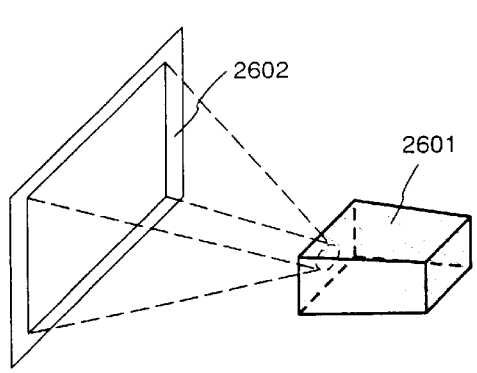
FIGS. 20A to 20D are diagrams showing examples of electronic devices.

FIG. 20A is a front type projector which comprises: a projection system 2601; and a screen 2602. The present invention can be applied to the liquid crystal module 2808 which forms a part of the projection system 2601 to complete the whole system.

Figure 20B:
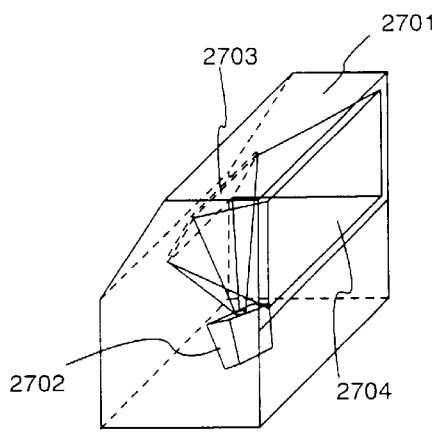

FIG. 20B is a rear type projector which comprises: a main body 2701; a projection system 2702; a mirror 2703; and a screen 2704. The present invention can be applied to the liquid crystal module 2808 which forms a part of the projection system 2702.

Figure 20C:
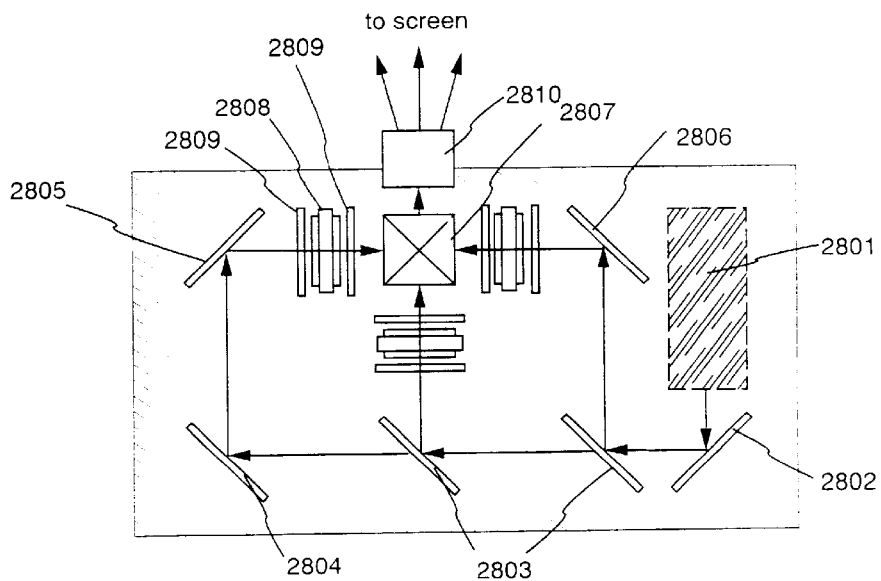

FIG. 20C is a diagram which shows an example of the structure of a projection system 2601 and 2702 in FIGS. 20A and 20B, respectively. Each of projection systems 2601 and 2702 comprises: an optical light source system 2801: mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though the present example shows an example of 3-plate type, this is not to limit to this example and a single plate type may be used for instance. Further, an operator may appropriately dispose an optical lens, a film which has a function to polarize light, a film which adjusts a phase difference or an IR film, etc. in the optical path shown by an arrow in FIG. 20C.

Figure 20D:
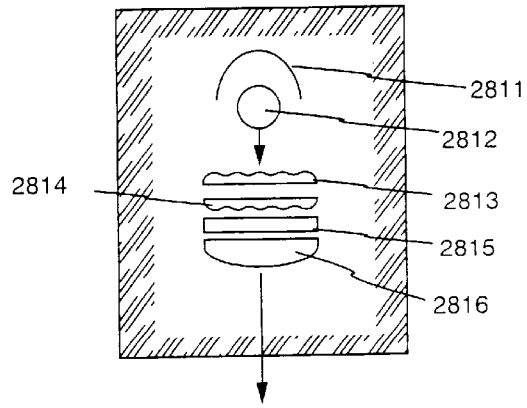

FIG. 20D is a diagram showing an example of a structure of an optical light source system 2801 in FIG. 20C. In this embodiment the optical light source system 2801 comprises: a reflector 2811; a light source 2812; lens arrays 2813 and 2814; a polarizer conversion element 2815; and a collimator lens 2816. Note that the optical light source system shown in FIG. 20D is merely an example and the structure is not limited to this example. For instance, an operator may appropriately dispose an optical lens, a film which has a function to polarize light, a film which adjusts a phase difference or an IR film, etc.

Note that the projectors shown FIGS. 20A–20D are the cases of using a transmission type electro-optical devices, and applicable examples of a reflection type electro-optical device and an EL module are not shown.

Figure 21A:
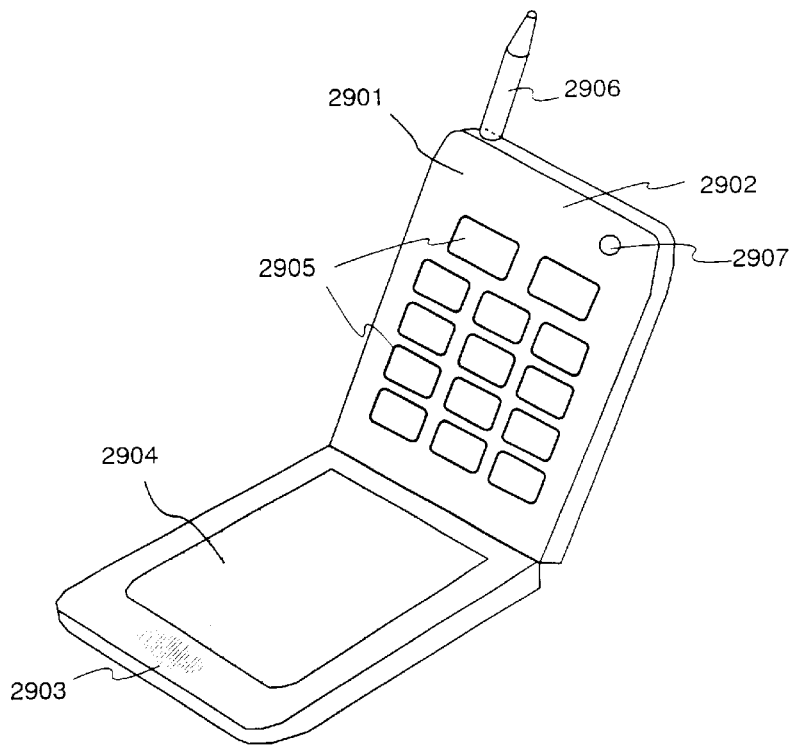
FIGS. 21A to 21C are diagrams showing examples of electronic devices.

FIG. 21A is a mobile telephone which comprises: a main body 2901; a voice output portion 2902; a voice input portion 2903; a display portion 2904; operation switches 2905; an antenna 2906; and an image input portion (CCD, image, sensor, etc.) 2907 etc. The present invention can be applied to the display portion 2904.

Figure 21B:
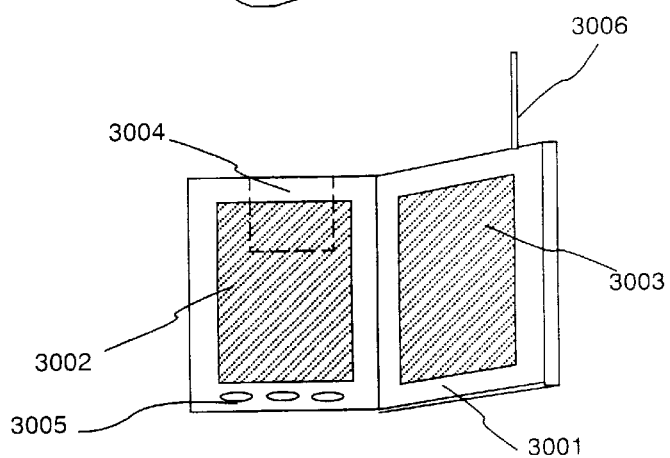

FIG. 21B is a portable book (electronic book) which comprises: a main body 3001; display portions 3002 and 3003; a recording medium 3004; operation switches 3005 and an antenna 3006 etc. The present invention can be applied to the display portions 3002 and 3003.

Figure 21C:
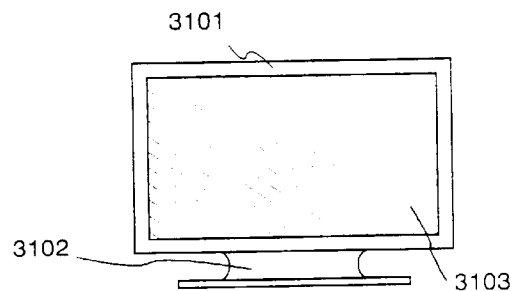

FIG. 21C is a display which comprises: a main body 3101; a supporting portion 3102; and a display portion 3103 etc. The present invention can be applied to the display portion 3103.

As described above, the applicable range of the present invention is very large, and the invention can be applied to electronic apparatuses of various areas. Note that the electronic devices of this embodiment can be achieved by utilizing any combination of constitutions in Embodiments 1 to 5.

According to the present invention, the rare gas element can be added to the semiconductor film to a high concentration in a short time, e.g., about one or two minutes. Therefore the throughput can be remarkably improved in comparison with gettering using phosphorus.

In comparison with gettering using phosphorus, the effect of gettering based on addition of the rare gas element in accordance with the present invention is high. Moreover, since the rare gas element can be added to a high concentration of, for example, $1 \times 10^{20}$ to $5 \times 10^{21}/cm^3$, the amount of the metallic element added for crystallization can be increased. That is, the processing time required for crystallization can be reduced by increasing the amount of the metallic element added for crystallization. If the processing time required for crystallization is not changed, the amount of the metallic element added for crystallization may be increased to enable crystallization at a lower temperature. Also, the amount of the metallic element added for crystallization may be increased to limit spontaneous nucleation, thereby enabling formation of a satisfactory crystalline semiconductor film.

What is claimed is:

1. A method of manufacturing a semiconductor device having a pixel portion and a driver circuit provided on an insulating surface, comprising the steps of:
    adding a metal element to a semiconductor film comprising amorphous silicon over a substrate;
    crystallizing the semiconductor film added with the metal element;
    forming an insulating film on the semiconductor film;
    forming an electrode having a tapered portion on the insulating film so that the electrode overlaps the semiconductor film;
    forming a first impurity region by selectively adding an impurity element imparting one conductivity type to the semiconductor film through the tapered portion of the electrode;
    selectively forming a second impurity region containing the impurity element imparting one conductivity type and a rare gas element in the semiconductor film in the pixel portion by providing a mask, and simultaneously forming the second impurity region in the driver circuit by using the electrode as a mask in a self-alignment manner; and
    selectively removing or reducing the metal element in the semiconductor film having the crystalline structure by gettering the metal element into the second impurity region.

2. A method of manufacturing a semiconductor device according to claim 1, wherein the step of forming the second impurity region includes providing as a raw material gas a rare gas containing phosphine, and adding the phosphorus element and the rare gas element to the semiconductor film in a same step.

3. A method of manufacturing a semiconductor device according to claim 1, wherein the step of forming the second impurity region includes providing as a raw material gas a hydrogen gas containing phosphine, adding the phosphorus element to the semiconductor film, and then adding the rare gas element to the semiconductor film by using a rare gas as a raw material gas without exposure to an atmosphere.

4. A method of manufacturing a semiconductor device according to claim 1, wherein the removing or reducing step comprises a heat treatment.

5. A method of manufacturing a semiconductor device according to claim 1, wherein the removing or reducing step comprises a process of irradiating at least the electrode and the second impurity region with a light.

6. A method of manufacturing a semiconductor device according to claim 1, wherein the removing or reducing step comprises a heat treatment and a process of irradiating at least the electrode and the second impurity region with a light.

7. A method of manufacturing a semiconductor device according to claim 1, wherein the semiconductor device is a liquid crystal display device.

8. A method of manufacturing a semiconductor device according to claim 1, wherein the semiconductor device is an electroluminescence display device.

9. A method of manufacturing a semiconductor device according to claim 1, wherein the semiconductor device is at least one selected from the group consisting of a personal computer, a video camera, a mobile computer, a goggle-type display, a player using a recording medium, a digital camera, a projector, a mobile telephone, and a portable book.

10. A method of manufacturing a semiconductor device comprising the steps of:

adding a metal element to a semiconductor film comprising amorphous silicon over a substrate;

crystallizing the semiconductor film added with the metal element;

forming an insulating film on the semiconductor film;

forming an electrode on the insulating film;

forming a first impurity region by selectively adding an impurity element imparting one conductivity type to the semiconductor film;

forming a second impurity region containing the impurity element imparting one conductivity type and a rare gas element adjacent to the first impurity region; and selectively removing or reducing the metal element in the semiconductor film having the crystalline structure by gettering the metal element into the second impurity region.

11. A method of manufacturing a semiconductor device according to claim 10, wherein the step of forming the second impurity region includes providing as a raw material gas a rare gas containing phosphine, and adding the phosphorus element and the rare gas element to the semiconductor film in a same step.

12. A method of manufacturing a semiconductor device according to claim 10, wherein the step of forming the second impurity region includes providing as a raw material gas a hydrogen gas containing phosphine, adding the phosphorus element to the semiconductor film, and then adding the rare gas element to the semiconductor film by using a rare gas as a raw material gas without exposure to an atmosphere.

13. A method of manufacturing a semiconductor device according to claim 10, wherein the removing or reducing step comprises a heat treatment.

14. A method of manufacturing a semiconductor device according to claim 10, wherein the removing or reducing step comprises a process of irradiating at least the electrode and the second impurity region with a light.

15. A method of manufacturing a semiconductor device according to claim 10, wherein the removing or reducing step comprises a heat treatment and a process of irradiating at least the electrode and the second impurity region with a light.

16. A method of manufacturing a semiconductor device according to claim 10, wherein the semiconductor device is a liquid crystal display device.

17. A method of manufacturing a semiconductor device according to claim 10, wherein the semiconductor device is an electroluminescence display device.

18. A method of manufacturing a semiconductor device according to claim 10, wherein the semiconductor device is at least one selected from the group consisting of a personal computer, a video camera, a mobile computer, a goggle-type display, a player using a recording medium, a digital camera, a projector, a mobile telephone, and a portable book.

19. A method of manufacturing a semiconductor device comprising the steps of:

adding a metal element to a semiconductor film comprising amorphous silicon over a substrate;

crystallizing the semiconductor film added with the metal element;

forming an insulating film on the semiconductor film;

forming an electrode having a tapered portion on the insulating film;

forming a first impurity region by selectively adding an impurity element imparting one conductivity type to the semiconductor film;

forming a second impurity region containing the impurity element imparting one conductivity type and a rare gas element adjacent to the first impurity region; and selectively removing or reducing the metal element in the semiconductor film having the crystalline structure by gettering the metal element into the second impurity region.

20. A method of manufacturing a semiconductor device according to claim 19, Wherein the step of forming the second impurity region includes providing as a raw material gas a rare gas containing phosphine, and adding the phosphorus element and the rare gas element to the semiconductor film in a same step.

21. A method of manufacturing a semiconductor device according to claim 19, wherein the step of forming the second impurity region includes providing as a raw material gas a hydrogen gas containing phosphine, adding the phosphorus element to the semiconductor film, and then adding the rare gas element to the semiconductor film by using a rare gas as a raw material gas without exposure to an atmosphere.

22. A method of manufacturing a semiconductor device according to claim 19, wherein the removing or reducing step comprises a heat treatment.

23. A method of manufacturing a semiconductor device according to claim 19, wherein the removing or reducing step comprises a process of irradiating at least the electrode and the second impurity region with a light.

24. A method of manufacturing a semiconductor device according to claim 19, wherein the removing or reducing step comprises a heat treatment and a process of irradiating at least the electrode and the second impurity region with a light.

25. A method of manufacturing a semiconductor device according to claim 19, wherein the semiconductor device is a liquid crystal display device.

26. A method of manufacturing a semiconductor device according to claim 19, wherein the semiconductor device is an electroluminescence display device.

27. A method of manufacturing a semiconductor device according to claim 19, wherein the semiconductor device is at least one selected from the group consisting of a personal computer, a video camera, a mobile computer, a goggle-type display, a player using a recording medium, a digital camera, a projector, a mobile telephone, and a portable book.

28. A method of manufacturing a semiconductor device comprising the steps of:

adding a metal element to a semiconductor film comprising amorphous silicon over a substrate;

crystallizing the semiconductor film added with the metal element;

forming an insulating film on the semiconductor film;

forming an electrode on the insulating film;

forming a first impurity region by selectively adding an impurity element imparting one conductivity type and a rare gas element to the semiconductor film;

forming a second impurity region containing the impurity element imparting one conductivity type between a channel region and the first impurity region; and selectively removing or reducing the metal element in the semiconductor film having the crystalline structure by gettering the metal element into the first impurity region.

29. A method of manufacturing a semiconductor device according to claim 28, wherein the step of forming the first impurity region includes providing as a raw material gas a rare gas containing phosphine, and adding the phosphorus element and the rare gas element to the semiconductor film in a same step.

30. A method of manufacturing a semiconductor device according to claim 28, wherein the step of forming the first impurity region includes providing as a raw material gas a hydrogen gas containing phosphine, adding the phosphorus element to the semiconductor film, and then adding the rare gas element to the semiconductor film by using a rare gas as a raw material gas without exposure to an atmosphere.

31. A method of manufacturing a semiconductor device according to claim 28, wherein the removing or reducing step comprises a heat treatment.

32. A method of manufacturing a semiconductor device according to claim 28, wherein the removing or reducing step comprises a process of irradiating at least the electrode and the second impurity region with a light.

33. A method of manufacturing a semiconductor device according to claim 28, wherein the removing or reducing step comprises a heat treatment and a process of irradiating at least the electrode and the second impurity region with a light.

34. A method of manufacturing a semiconductor device according to claim 28, wherein the semiconductor device is a liquid crystal display device.

35. A method of manufacturing a semiconductor device according to claim 28, wherein the semiconductor device is an electroluminescence display device.

36. A method of manufacturing a semiconductor device according to claim 28, wherein the semiconductor device is at least one selected from the group consisting of a personal computer, a video camera, a mobile computer, a goggle-type display, a player using a recording medium, a digital camera, a projector, a mobile telephone, and a portable book.

37. A method of manufacturing a semiconductor device comprising the steps of:

adding a metal element to a semiconductor film comprising amorphous silicon over a substrate;

crystallizing the semiconductor film added with the metal element;

forming an insulating film on the semiconductor film;

forming an electrode having a tapered portion on the insulating film;

forming a first impurity region by selectively adding an impurity element imparting one conductivity type and a rare gas element to the semiconductor film;

forming a second impurity region containing the impurity element imparting one conductivity type between a channel region and the first impurity region; and selectively removing or reducing the metal element in the semiconductor film having the crystalline structure by gettering the metal element into the first impurity region.

38. A method of manufacturing a semiconductor device according to claim 37, wherein the step of forming the first impurity region includes providing as a raw material gas a rare gas containing phosphine, and adding the phosphorus element and the rare gas element to the semiconductor film in a same step.

39. A method of manufacturing a semiconductor device according to claim 37, wherein the step of forming the first impurity region includes providing as a raw material gas a hydrogen gas containing phosphine, adding the phosphorus element to the semiconductor film, and then adding the rare gas element to the semiconductor film by using a rare gas as a raw material gas without exposure to an atmosphere.

40. A method of manufacturing a semiconductor device according to claim 37, wherein the removing or reducing step comprises a heat treatment.

41. A method of manufacturing a semiconductor device according to claim 37, wherein the removing or reducing step comprises a process of irradiating at least the electrode and the second impurity region with a light.

42. A method of manufacturing a semiconductor device according to claim 37, wherein the removing or reducing step comprises a heat treatment and a process of irradiating at least the electrode and the second impurity region with a light.

43. A method of manufacturing a semiconductor device according to claim 37, wherein the semiconductor device is a liquid crystal display device.

44. A method of manufacturing a semiconductor device according to claim 37, wherein the semiconductor device is an electroluminescence display device.

45. A method of manufacturing a semiconductor device according to claim 37, wherein the semiconductor device is at least one selected from the group consisting of a personal computer, a video camera, a mobile computer, a goggle-type display, a player using a recording medium, a digital camera, a projector, a mobile telephone, and a portable book.

* * * * *